(12) United States Patent
Abuhamdeh et al.

(10) Patent No.: US 9,344,075 B2
(45) Date of Patent: May 17, 2016

(54) MEASURING DELAY BETWEEN SIGNAL EDGES OF DIFFERENT SIGNALS USING AN UNDERSAMPLING CLOCK

(71) Applicant: Advanced Micro Devices, Inc., Sunnyvale, CA (US)

(72) Inventors: Zahi S. Abuhamdeh, Billerica, MA (US); Michael Ricchetti, Nashua, NH (US); Richard Lombard, Millbury, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 14/338,905

(22) Filed: Jul. 23, 2014

(65) Prior Publication Data

US 2016/0028387 A1    Jan. 28, 2016

(51) Int. Cl.
*H03K 5/26* (2006.01)

(52) U.S. Cl.
CPC .......................................... *H03K 5/26* (2013.01)

(58) Field of Classification Search
CPC .......... F02B 2075/00; F02B 2075/027; G01N 27/00; G01N 27/9046; G01R 29/00; G01R 29/02; G01R 29/0273; H03G 3/00; H03G 3/345; H03K 5/00; H03K 5/26
USPC .......................................................... 327/33
See application file for complete search history.

(56) References Cited

U.S. PATENT DOCUMENTS 7,062,733 B1 *   6/2006   Poskatcheev ........... G04F 10/06
                                                              716/113

OTHER PUBLICATIONS

Ian Cutress et al., "AMD Kaveri Review: A8-7600 and A10:7850K Tested", http://www.anandtech.com/show/7677/arnd-kaveri-review-a8-7600-a10-...1, Jan. 14, 2014, 7 pages.
Wikipedia, "Automatic test equipment", http://en.wikipedia.org/wiki/Automatic_test_equipment, May 8, 2014, 8 pages.

* cited by examiner

*Primary Examiner* — John Poos
*Assistant Examiner* — David Mattison
(74) *Attorney, Agent, or Firm* — Harrity & Harrity, LLP

(57) ABSTRACT

A system may measure a first sample, of a first signal, using an undersampling signal. The system may measure a second sample, of a second signal, using the undersampling signal. The undersampling signal may have a frequency that is based on a frequency of the first signal or a frequency of the second signal. The system may detect, based on measuring the first sample, a first edge of the first signal. The system may detect, based on measuring the second sample, a second edge of the second signal. The system may determine a delay, associated with the first signal and the second signal, based on detecting the first edge, based on detecting the second edge, based on a first cycle time of the undersampling signal, and based on a second cycle time of the first signal or the second signal.

20 Claims, 15 Drawing Sheets

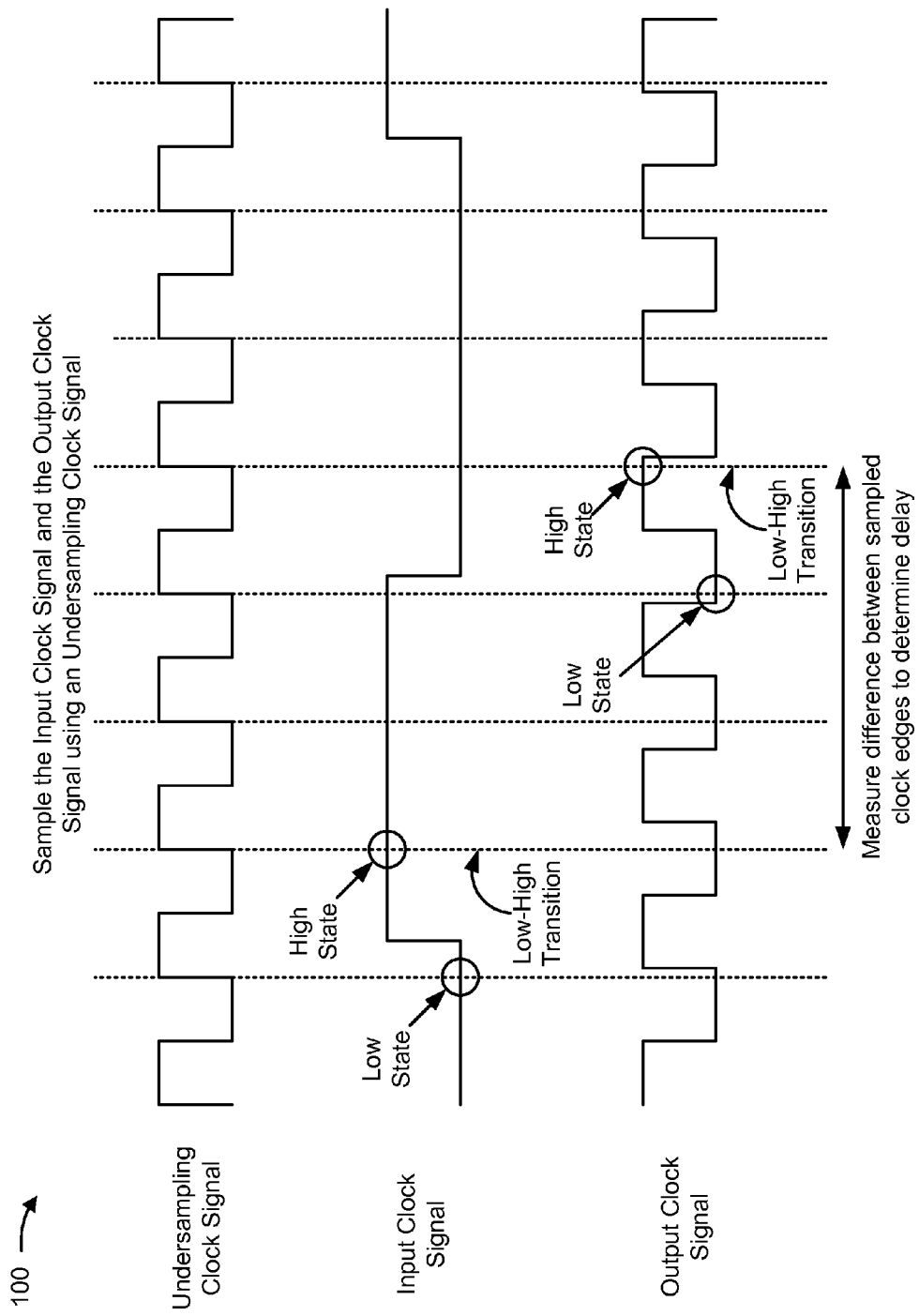

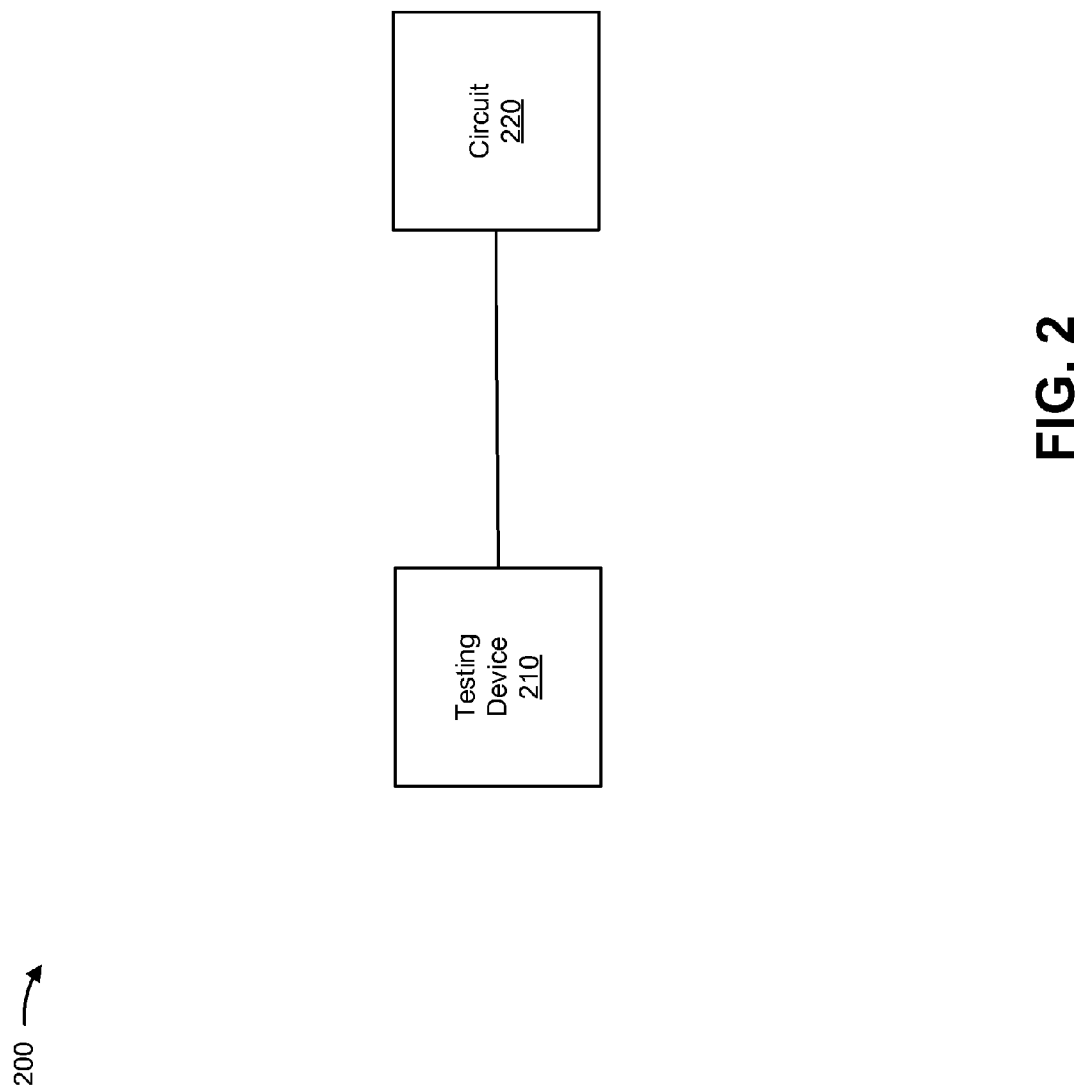

MEASURING DELAY BETWEEN SIGNAL EDGES OF DIFFERENT SIGNALS USING AN UNDERSAMPLING CLOCK

BACKGROUND

Different integrated circuits may operate differently due to variations in a voltage supplied to the integrated circuit, variations in temperature of different components during operation of the integrated circuit, and/or variations in a manufacturing process used to fabricate the integrated circuit. For example, different circuits may introduce different internal delays to signals passing through the different circuits.

SUMMARY OF EXAMPLE EMBODIMENTS

According to some possible embodiments, a method may include sampling, by a circuit, a first signal and a second signal using an undersampling clock signal. The undersampling clock signal may have a frequency that is different from a frequency of the first signal or a frequency of the second signal by an offset amount. The method may include detecting, by the circuit and based on sampling the first signal, a first edge of the first signal, and may include detecting, by the circuit and based on sampling the second signal, a second edge of the second signal. The method may include determining, by the circuit, a quantity of samples measured between a first sample, used to detect the first edge, and a second sample used to detect the second edge. The method may include determining, by the circuit and based on the quantity of samples and the offset amount, a delay associated with the first signal and the second signal.

According to some possible embodiments, a device may measure a first sample, of a first signal, using a sampling signal. The device may measure a second sample, of a second signal, using the sampling signal. The sampling signal may have a frequency that is based on a frequency of the first signal or a frequency of the second signal. The device may detect, based on measuring the first sample, a first state transition of the first signal. The device may detect, based on measuring the second sample, a second state transition of the second signal. The second state transition may be a same type of transition as the first state transition. The device may determine a delay between the first state transition and the second state transition based on detecting the first state transition, based on detecting the second state transition, and based on a cycle time of the sampling signal.

According to some possible embodiments, a system may measure a first sample, of a first signal, using an undersampling signal. The system may measure a second sample, of a second signal, using the undersampling signal. The undersampling signal may have a frequency that is based on a frequency of the first signal or a frequency of the second signal. The system may detect, based on measuring the first sample, a first edge of the first signal. The system may detect, based on measuring the second sample, a second edge of the second signal. The system may determine a delay, associated with the first signal and the second signal, based on detecting the first edge, based on detecting the second edge, based on a first cycle time of the undersampling signal, and based on a second cycle time of the first signal or the second signal.

BRIEF DESCRIPTION OF THE DRAWINGS

FIGS. 1A and 1B are diagrams of an overview of an example embodiment described herein;

FIG. 2 is a diagram of an example environment in which systems and/or methods described herein may be implemented, in some embodiments;

DETAILED DESCRIPTION OF EXAMPLE EMBODIMENTS

The following detailed description of example embodiments refers to the accompanying drawings. The same reference numbers in different drawings may identify the same or similar elements.

An integrated circuit may introduce a delay to a signal passing through the circuit. For example, a circuit may receive an input signal, may process the input signal to generate an output signal, and may provide the output signal. The amount of time that the circuit spends processing the input signal (e.g., the delay) may vary across different circuits. Such variation may be due to variations in a voltage supplied to the circuit, variations in temperature of different components of the circuit, and/or variations in a manufacturing process used to fabricate the circuit.

It is often important to determine the delay associated with a circuit. For example, the delay may be used to calibrate the circuit, to test the circuit, to improve operation of the circuit, or the like. Some techniques to measure circuit delay utilize a binary search algorithm, which may be slow and costly. Embodiments described herein utilize an undersampling clock to determine circuit delay accurately and quickly relative to utilizing a binary search algorithm (e.g., up to ten times faster).

Figure 1A:
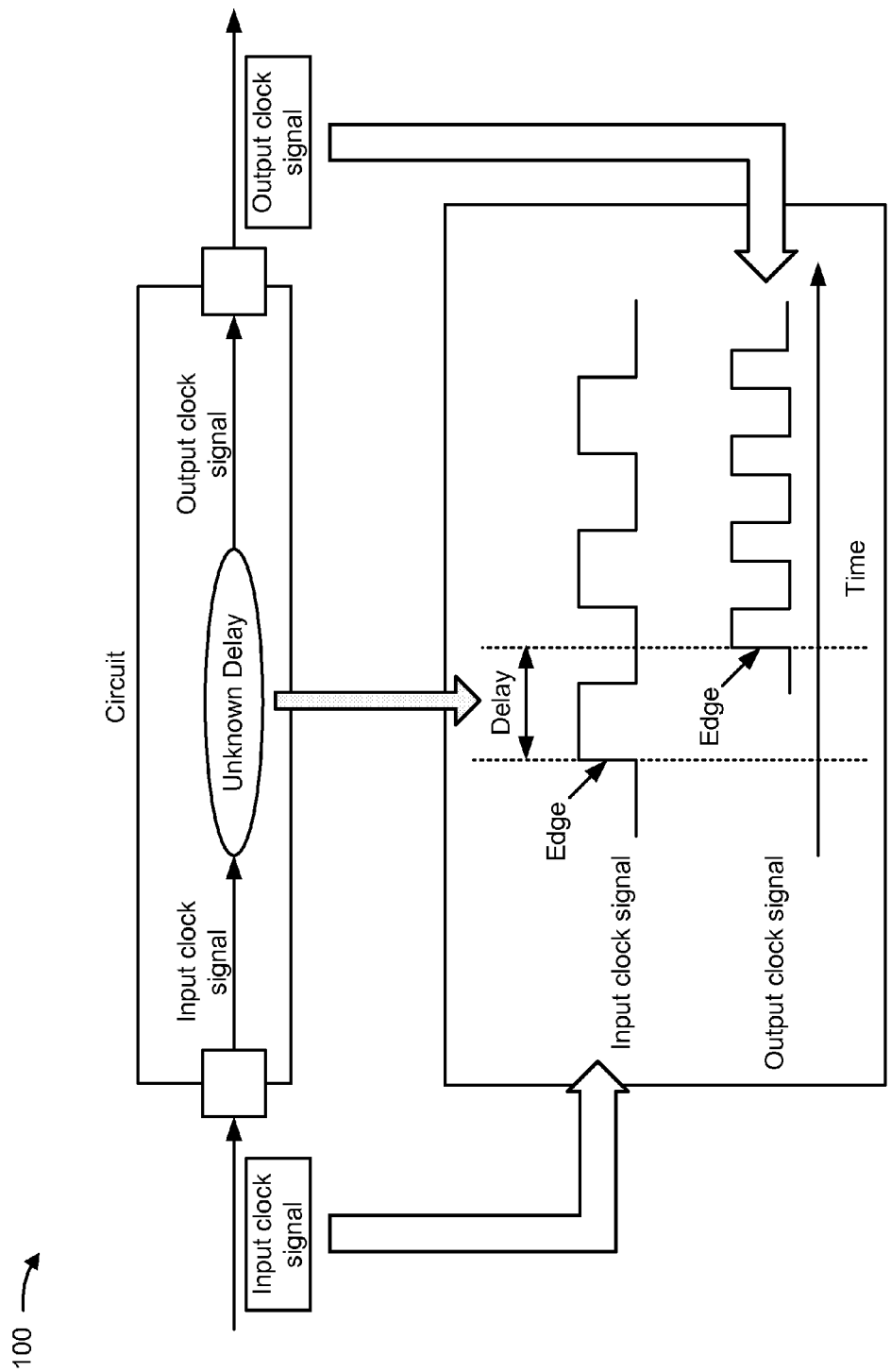

FIGS. 1A and 1B are diagrams of an overview of an example embodiment 100 described herein. As shown in FIG. 1A, a circuit may receive an input clock signal. The circuit may perform some processing on the input clock signal to generate an output clock signal. This processing may introduce an unknown delay in the amount of time between when the input clock signal (e.g., an edge of the input clock signal) is received and when the output clock signal (e.g., an edge of the output clock signal) is transmitted.

As shown in FIG. 1B, the circuit may use an undersampling clock to measure a time difference between corresponding clock edges, such as a positive edge of the input clock signal and a positive edge of the output clock signal. In some embodiments, the undersampling clock signal includes a clock signal that may be used to reconstruct the input clock signal and the output clock signal by sampling the input clock signal and the output clock signal at a particular interval.

As further shown in FIG. 1B, the circuit may sample the input clock signal and the output clock signal when a positive edge of the undersampling clock is detected. The input clock samples may be used to detect a positive edge of the input clock signal when consecutive samples of the input clock signal indicate a transition from a low state to a high state.

Similarly, the output clock samples may be used to detect a positive edge of the output clock signal when consecutive samples of the output clock signal indicate a transition from a low state to a high state. The circuit may identify consecutive positive edges on the input clock signal and the output clock signal. The circuit may measure a time difference between these consecutive edges, and may use the difference to determine a delay between the corresponding clock edges.

While the circuit is described above as sampling the input clock signal and the output clock signal to determine a delay between corresponding positive clock edges, in some embodiments, the circuit samples the input clock signal and the output clock signal to determine a delay between corresponding negative clock edges.

In this way, the circuit may quickly and accurately determine a delay associated with the circuit. This delay may be used to test the circuit, to calibrate the circuit, to improve operation of the circuit, etc. For example, the circuit may provide information that identifies the delay to a testing device, and the testing device may use the delay to test the circuit.

FIG. 2 is a diagram of an example environment 200 in which systems and/or methods described herein may be implemented, in some embodiments. As shown in FIG. 2, environment 200 may include a testing device 210 and a circuit 220. Devices of environment 200 may interconnect via a wired connection or a wireless connection.

Testing device 210 may include one or more devices capable of testing circuit 220 and/or evaluating test results (e.g., to diagnose faults, to determine tolerances, etc.). For example, testing device 210 may include automated test equipment (ATE) (e.g., a semiconductor ATE, or the like), manual test equipment, electronic test equipment, etc. Testing device 210 may test an electronic component (e.g., resistors, capacitors, inductors, etc.), a circuit (e.g., an integrated circuit, a chip, etc.), a printed circuit board, an assembled electronic system, etc. In some embodiments, testing device 210 includes a master controller (e.g., a computer), which may synchronize one or more source instruments and/or capture instruments. Testing device 210 may connect to circuit 220 via a device (e.g., a handler, a prober, etc.) and/or via an interface (e.g., an interface test adapter, a mass interconnect, etc.).

Circuit 220 may include an electronic circuit. For example, circuit 220 may include an integrated circuit, a silicon chip, a microchip, a semiconductor device, a processor (e.g., a central processing unit (CPU), a graphics processing unit (GPU), an accelerated processing unit (APU), etc.), a processor core, a field-programmable gate array (FPGA), an application-specific integrated circuit (ASIC), a memory chip (e.g., flash memory, random access memory (RAM), etc.), etc. In some embodiments, circuit 220 converts a first clock signal with a first data rate (e.g., a single data rate (SDR) clock signal) to a second clock signal with a second data rate (e.g., a double data rate (DDR) clock signal). For example, circuit 220 may use a phase-locked loop (PLL) and/or a delay-locked loop (DLL) to convert the first clock signal into the second clock signal. This conversion may take a different amount of time (e.g., an internal circuit delay) depending on an operating condition of circuit 220 and/or a manufacturing process used to fabricate circuit 220.

The number of devices shown in FIG. 2 is provided as an example. In practice, there may be additional devices, fewer devices, different devices, or differently arranged devices than those shown in FIG. 2. Furthermore, two or more devices shown in FIG. 2 may be implemented within a single device, or a single device shown in FIG. 2 may be implemented as multiple, distributed devices. Additionally, one or more of the devices of environment 200 may perform one or more functions described as being performed by another one or more devices of environment 200.

Figure 3:
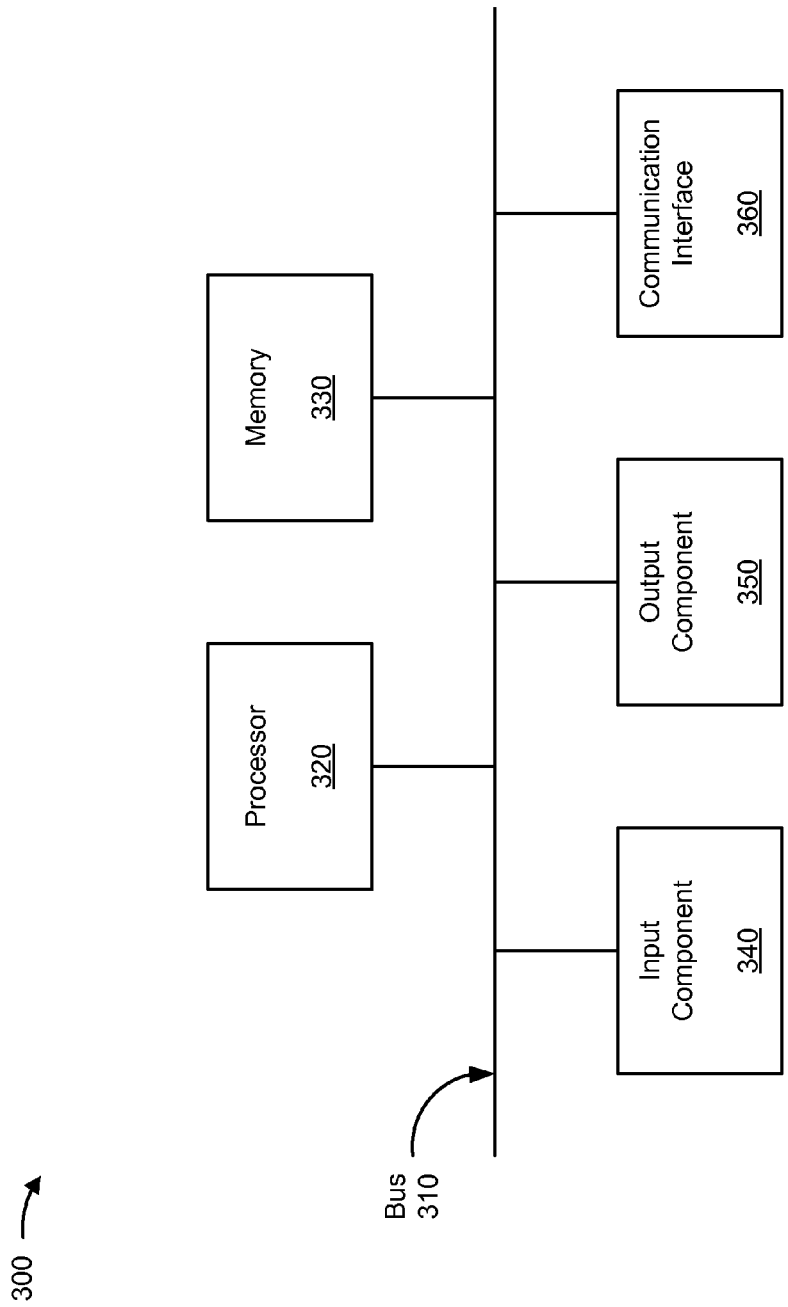
FIG. 3 is a diagram of example components of one or more devices of FIG. 2.

FIG. 3 is a diagram of example components of a device 300. In some embodiments, device 300 corresponds to testing device 210 and/or circuit 220. Additionally, or alternatively, each of testing device 210 and/or circuit 220 may include one or more devices 300 and/or one or more components of device 300. As shown in FIG. 3, device 300 may include a bus 310, a processor 320, a memory 330, an input component 340, an output component 350, and a communication interface 360.

Bus 310 may include a component that permits communication among the components of device 300. Processor 320 may include a processor (e.g., a CPU, a GPU, an APU, etc.), a microprocessor, one or more processing cores, and/or any processing component (e.g., an FPGA, an ASIC, etc.) that interprets and/or executes instructions. Memory 330 may include a random access memory (RAM), a read only memory (ROM), and/or another type of dynamic or static storage device (e.g., a flash, magnetic, or optical memory) that stores information and/or instructions for use by processor 320.

Input component 340 may include a component that permits a user to input information to device 300 (e.g., a touch screen display, a keyboard, a keypad, a mouse, a button, a switch, etc.). Output component 350 may include a component that outputs information from device 300 (e.g., a display, a speaker, one or more light-emitting diodes (LEDs), etc.).

Communication interface 360 may include a transceiver-like component, such as a transceiver and/or a separate receiver and transmitter, that enables device 300 to communicate with other devices, such as via a wired connection, a wireless connection, or a combination of wired and wireless connections. For example, communication interface 360 may include a serial interface, a mass interconnect, etc.

Device 300 may perform one or more processes described herein. Device 300 may perform these processes in response to processor 320 executing software and/or firmware instructions included in a computer-readable medium, such as memory 330. A computer-readable medium is defined herein as a non-transitory memory device. A memory device includes memory space within a single physical storage device or memory space spread across multiple physical storage devices.

Software and/or firmware instructions may be read into memory 330 from another computer-readable medium or from another device via communication interface 360. When executed, software instructions stored in memory 330 may cause processor 320 to perform one or more processes described herein. Additionally, or alternatively, hardwired circuitry may be used in place of or in combination with software instructions to perform one or more processes described herein. Thus, embodiments described herein are not limited to any specific combination of hardware circuitry and software.

The number of components shown in FIG. 3 is provided as an example. In practice, device 300 may include additional components, fewer components, different components, or differently arranged components than those shown in FIG. 3. Additionally, one or more of the components of device 300 may perform one or more functions described as being performed by another one or more components of device 300.

Figure 4:
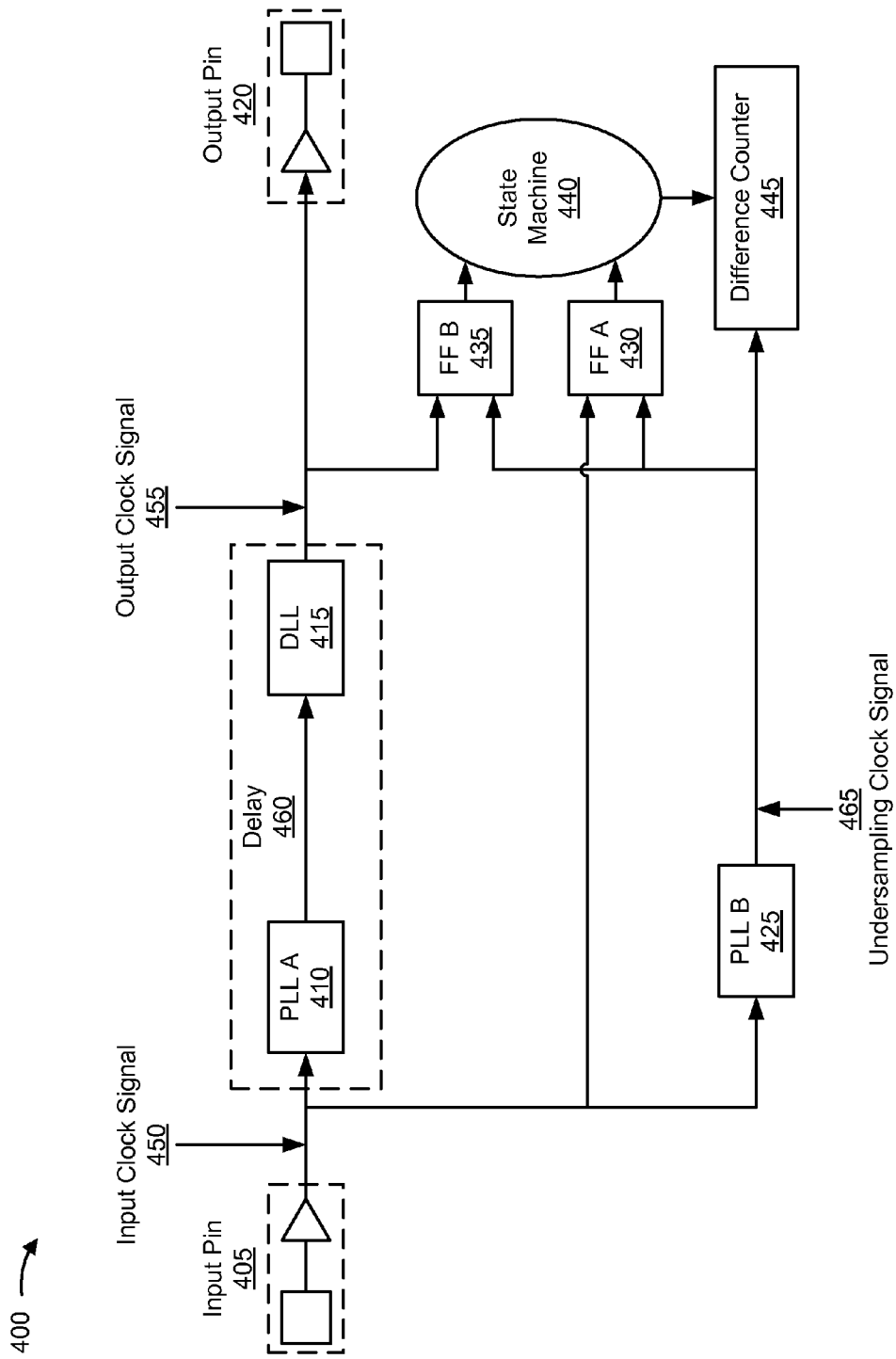
FIG. 4 is a functional block diagram of example components of a circuit.

FIG. 4 is a functional block diagram of example components 400 of circuit 220. As shown, components 400 may include an input pin 405, a first phase-locked loop 410 (shown as "PLL A 410"), a delay-locked loop 415 (shown as "DLL 415"), an output pin 420, a second phase-locked loop 425 (shown as "PLL B 425"), a first flip-flop 430 (shown as "FF A 430"), a second flip-flop 435 (shown as "FF B 435"), a state machine 440, and a difference counter 445. Two or more of components 400 interconnect via a wired connection, in some embodiments.

Input pin 405 may include one or more components via which an input signal may be received by circuit 220. For example, input pin 405 may include a general purpose input/output pin (e.g., which may be programmed for a specific purpose), a special input/output pin designed to perform a specialized function, or the like. In some embodiments, an input clock signal 450 is received by circuit 220 via input pin 405. Input clock signal 450 may include, for example, a reference clock signal used to synchronize and/or schedule operations by circuit 220 and/or testing device 210. In some embodiments, input pin 405 includes an interface with testing device 210. As shown, input pin 405 may transmit input clock signal 450 (e.g., via a wire) to one or more of PLL A 410, PLL B 425, and/or FF B 435.

PLL A 410 may include one or more components that form a phase-locked loop (e.g., a digital PLL). For example, PLL A 410 may include a phase detector, a filter, an oscillator, and/or a feedback component (e.g., a wire that feeds an output from PLL A 410 back as an input to PLL A 410). PLL A 410 may receive input clock signal 450 (e.g., from input pin 405), and may generate an output signal with a phase that is related to the phase of input clock signal 450. For example, PLL A 410 may assist in generating an output clock signal 455. In some embodiments, PLL A 410 increases (e.g., multiplies) an operating frequency of input clock signal 450 to generate output clock signal 455 with an operating frequency that is a multiple of the operating frequency of input clock signal 450 (e.g., an integer multiple or a non-integer multiple). As an example, input clock signal 450 may include an SDR clock signal, and output clock signal 455 may include a DDR clock signal with a frequency that is twice the frequency of input clock signal 450.

DLL 415 may include one or more components that form a delay-locked loop (e.g., a digital DLL). For example, DLL 415 may include a phase detector and/or comparator, a filter, a delay line, and/or a feedback component. DLL 415 may assist in generating output clock signal 455.

Output pin 420 may include one or more components via which an output signal may be transmitted by circuit 220. For example, output pin 420 may include a general purpose input/output pin (e.g., which may be programmed for a specific purpose), a special input/output pin designed to perform a specialized function, or the like. In some embodiments, output clock signal 455 is transmitted by circuit 220 via output pin 420. In some embodiments, output pin 420 includes an interface with testing device 210.

Operation of PLL A 410 and/or DLL 415 may introduce a delay 460 in the generation of output clock signal 455 from input clock signal 450. The length of delay 460 may be variable (e.g., across different circuits 220 and/or within a single circuit 220 tested at different times) due to variations in a voltage supplied to circuit 220, variations in temperature of different components 400 of circuit 220, and/or variations in a manufacturing process used to fabricate circuit 220. Components 425-445 may assist in determining delay 460.

PLL B 425 may include one or more components that form a phase-locked loop. For example, PLL B 425 may include a phase detector, a filter, an oscillator, and/or a feedback component. PLL B 425 may receive input clock signal 450 (e.g., from input pin 405), and may generate an output signal with a phase that is related to the phase of input clock signal 450.

In some embodiments, PLL B 425 assists in generating an undersampling clock signal 465. For example, PLL B 425 may multiply a frequency or a cycle time of input clock signal 450 by a particular value to obtain a frequency or a cycle time of undersampling clock signal 465. Additionally, or alternatively, PLL B 425 may offset a frequency or a cycle time of undersampling clock signal 465 from a frequency or cycle time of input clock signal 450 and/or output clock signal 455. As an example, PLL B 425 may be configured to generate undersampling clock signal 465 with a frequency and/or cycle time that is greater than or less than the frequency and/or cycle time of input clock signal 450 and/or output clock signal 455 by an offset amount.

Circuit 220 may use undersampling clock signal 465 to sample input clock signal 450 and output clock signal 455 to determine a delay between corresponding edges (e.g., corresponding positive edges, corresponding negative edges, etc.) of input clock signal 450 and output clock signal 455. Circuit 220 may set a sample rate of undersampling clock signal 465 to a rate that is below a Nyquist rate of input clock signal 450 and/or output clock signal 455, but that is still capable of being used to reconstruct input clock signal 450 and/or output clock signal 455.

FF A 430 may include one or more components that form a flip-flop and/or another circuit capable of storing state information (e.g., a latch). As shown, FF A 430 may receive input clock signal 450 (e.g., from input pin 405) and undersampling clock signal 465 (e.g., from PLL B 425). FF A 430 may sample input clock signal 450 based on a sampling rate of undersampling clock signal 465. For example, FF A 430 may sample input clock signal 450, upon detecting an edge of undersampling clock signal 465, to determine whether input clock signal 450 is in a high state or a low state. FF A 430 may provide, to state machine 440, an indication of whether input clock signal 450 is in the high state or the low state.

FF B 435 may include one or more components that form a flip-flop and/or another circuit capable of storing state information (e.g., a latch). As shown, FF B 435 may receive output clock signal 455 (e.g., from DLL 415) and undersampling clock signal 465 (e.g., from PLL B 425). FF B 435 may sample output clock signal 455 based on a sampling rate of undersampling clock signal 465. For example, FF B 435 may sample output clock signal 455 upon detecting an edge of undersampling clock signal 465 (e.g., a positive edge and/or a negative edge) to determine whether output clock signal 455 is in a high state or a low state. FF B 435 may provide, to state machine 440, an indication of whether output clock signal 455 is in the high state or the low state.

In some embodiments, FF A 430 is placed a first distance (e.g., along a wire) from input pin 405, and FF B 435 is placed a second distance from DLL 415, such that the first distance and the second distance result in an equal or an approximately equal (e.g., within a tolerance threshold) propagation delay. Additionally, or alternatively, PLL B 425 may be placed an equal or an approximately equal distance from each of FF A 430 and FF B 435, such that the undersampling clock signal arrives at FF A 430 and FF B 435 at the same time (or nearly the same time).

State machine 440 may include one or more components that form a state machine (e.g., a finite state machine) capable of storing state information (e.g., in one or more registers). In some embodiments, state machine 440 operates based on information received via a testing interface (e.g., a Joint Test Action Group (JTAG)-based interface, or the like). State machine 440 may receive, from FF A 430, an indication of whether input clock signal 450 is in the high state or the low state. For example, state machine 440 may receive a first value (e.g., one) from FF A 430 when input clock signal 450 is in the high state, and may receive a second value (e.g., zero) from FF A 430 when input clock signal 450 is in the low state. Similarly, state machine 440 may receive, from FF B 435, an indication of whether output clock signal 455 is in the high state or the low state.

State machine 440 may provide an indication of a state transition of input clock signal 450 and/or output clock signal 455 to difference counter 445. For example, state machine 440 may provide an indication, to difference counter 445, that input clock signal 450 transitioned from a low state to a high state (e.g., via a positive edge), and/or transitioned from a high state to a low state (e.g., via a negative edge). As another example, state machine 440 may provide an indication, to difference counter 445, that output clock signal 455 transitioned from a low state to a high state and/or transitioned from a high state to a low state.

Difference counter 445 may include one or more components capable of storing information and/or counting a quantity of events that occur between two triggering events. For example, difference counter 445 may include one or more registers (e.g., a status register, a hardware register, a flag register, etc.) for storing information. Difference counter 445 may receive, from state machine 440, an indication that input clock signal 450 experienced a state transition, and may receive an indication that output clock signal 455 experienced a state transition. Difference counter 445 may count a quantity of samples taken (e.g., using undersampling clock signal 465) following a state transition of a first clock signal (e.g., input clock signal 450) until a state transition of a second clock signal (e.g., output clock signal 455).

As an example, assume that difference counter 445 receives, from state machine 440, a first indication that input clock signal 450 transitioned from a low state to a high state. At a later time, assume that difference counter 445 receives, from state machine 440, a second indication that output clock signal 455 transitioned from a low state to a high state. Difference counter 445 may count a quantity of samples taken (e.g., by FF A 430 and/or FF B 435 using undersampling clock signal 465) between receiving the first indication and the second indication (e.g., including or excluding one or both of a first sample used to detect the transition of input clock signal 450, or a second sample used to detect the transition of output clock signal 455). As shown, difference counter 445 may receive undersampling clock signal 465 from PLL B 425. Difference counter 445 may use undersampling clock signal 465 to determine a quantity of samples taken (e.g., based on a quantity of positive edges detected by difference counter 445) between receiving the first indication and the second indication. Circuit 220 may use this value to determine delay 460 (e.g., by multiplying the quantity of samples by the offset amount associated with undersampling clock signal 465).

The number of components shown in FIG. 4 is provided as an example. In practice, components 400 may include additional components, fewer components, different components, or differently arranged components than those shown in FIG. 4. Additionally, one or more of components 400 may perform one or more functions described as being performed by another one or more of components 400.

Figure 5:
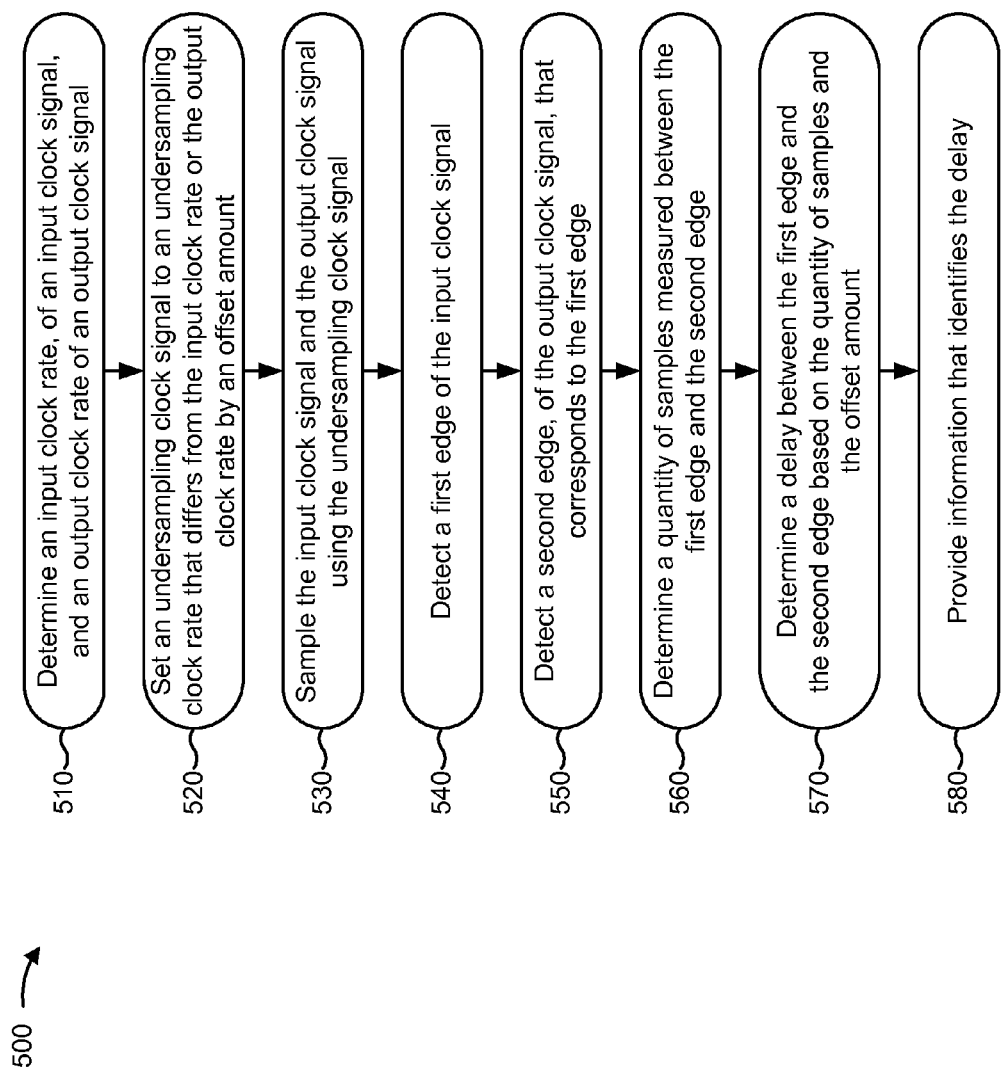
FIG. 5 is a flow chart of an example process for measuring a delay between two signal edges using an undersampling clock.

FIG. 5 is a flow chart of an example process 500 for measuring a delay between two signal edges using an undersampling clock. In some embodiments, one or more process blocks of FIG. 5 are performed by circuit 220. In some embodiments, one or more process blocks of FIG. 5 are performed by another device or a group of devices separate from or including circuit 220, such as testing device 210.

As shown in FIG. 5, process 500 may include determining an input clock rate, of an input clock signal, and an output clock rate, of an output clock signal (block 510). For example, circuit 220 may determine an input clock rate and an output clock rate. The input clock rate may represent a frequency of oscillation of input clock signal 450 (e.g., a frequency of an oscillation between a high state and a low state), may represent a quantity of oscillation cycles of input clock signal 450 per unit of time (e.g., measured in hertz, kilohertz, megahertz, gigahertz, etc.), and/or may represent a cycle time of input clock signal 450 (e.g., an amount of time required to traverse one clock cycle, measured in seconds, nanoseconds, picoseconds, etc.). Similarly, the output clock rate may represent a frequency of oscillation of output clock signal 455, may represent a quantity of oscillation cycles of output clock signal 455 per unit of time, and/or may represent a cycle time of output clock signal 455.

In some embodiments, the frequency of the output clock rate is greater than the frequency of the input clock rate. For example, circuit 220 may receive input clock signal 450, and may modify input clock signal 450 to generate output clock signal 455 with a greater frequency than input clock signal 450 (e.g., using PLL A 410 and/or DLL 415). Additionally, or alternatively, the frequency of the output clock rate is less than the frequency of the input clock rate.

Some embodiments are described herein as performing one or more operations in connection with two clock signals. However, these operations may be performed in connection with two data signals, a clock signal and a data signal, or the like.

As further shown in FIG. 5, process 500 may include setting an undersampling clock signal to an undersampling clock rate that differs from the input clock rate or the output clock rate by an offset amount (block 520). For example, circuit 220 may configure PLL B 425 to generate undersampling clock 465 with an undersampling clock rate. In some embodiments, circuit 220 sets the undersampling clock rate to a rate that is below a Nyquist rate (e.g., two times the frequency) of input clock signal 450 and/or output clock signal 455, but that is still capable of being used to reconstruct input clock signal 450 and/or output clock signal 455. As an example, the frequency of the undersampling clock may be set to a value that is greater than a frequency of input clock signal 450 and/or output clock signal 455, but that is less than twice the frequency of input clock signal 450 and/or output clock signal 455.

As another example, circuit 220 may set undersampling clock signal 465 to a frequency that is greater than or less than the frequency of input clock signal 450 or output clock signal 455 by a particular offset amount. As another example, circuit 220 may set undersampling clock signal 465 to a cycle time that is greater than or less than the cycle time of input clock signal 450 or output clock signal 455 by a particular offset amount. Circuit 220 may determine the offset amount based on input received from a user (e.g., a tester) and/or input received from another device (e.g., testing device 210).

In some embodiments, the offset amount represents a difference in cycle time between undersampling clock signal 465 and input clock signal 450, or a difference in cycle time between undersampling clock signal 465 and output clock signal 455. For example, assume that output clock signal 455 has a cycle time that is half that of input clock signal 450. In this case, circuit 220 may set the cycle time of undersampling clock signal 465 by multiplying the cycle time of input clock signal 450 by 0.5 (e.g., half), and adding or subtracting an offset value. In some embodiments, the offset value is less than approximately 100 picoseconds. The offset value may be adjusted to impact an accuracy of a delay measurement. In some embodiments, circuit 220 uses a lower offset value for a more accurate and/or a quicker delay measurement (e.g., more accurate and/or quicker than using a higher offset value).

As further shown in FIG. 5, process 500 may include sampling the input clock signal and the output clock signal using the undersampling clock signal (block 530). For example, circuit 220 may sample input clock signal 450 using FF A 430 and undersampling clock signal 465. When FF A 430 detects a state transition (e.g., a positive edge, a negative edge, etc.) in undersampling clock signal 465, then FF A 430 may sample input clock signal 450 to determine whether input clock signal 450 is in a high state or a low state. Similarly, circuit 220 may sample output clock signal 455 using FF B 435 and undersampling clock signal 465. When FF B 435 detects a state transition in undersampling clock signal 465, then FF B 435 may sample output clock signal 455 to determine whether output clock signal 455 is in a high state or a low state.

As further shown in FIG. 5, process 500 may include detecting a first edge of the input clock signal (block 540). For example, circuit 220 may detect a first edge of input clock signal 450 using FF A 430 and state machine 440. State machine 440 may receive an indication of a current state (e.g., high or low) of input clock signal 450 from FF A 430. State machine 440 may compare the current state of input clock signal 450 to a previous state of input clock signal 450 to determine whether input clock signal 450 experienced a state transition (e.g., from high to low, or from low to high).

If state machine 440 determines that that the current state matches the previous state, then state machine 440 may determine that input clock signal 450 did not experience a state transition. If state machine 440 determines that that the current state does not match the previous state, then state machine 440 may determine that input clock signal 450 experienced a state transition. Input clock signal 450 may transition from a low state to a high state on a positive edge (e.g., a rising edge) of the clock signal. In this case, state machine 440 may receive, from FF A 430, an indication of a low state (e.g., a zero), followed by an indication of a high state (e.g., a one). Similarly, input clock signal 450 may transition from a high state to a low state on a negative edge (e.g., a falling edge) of the clock signal. In this case, state machine 440 may receive, from FF A 430, an indication of a high state (e.g., a one), followed by an indication of a low state (e.g., a zero). In some embodiments, state machine 440 detects a positive edge of input clock signal 450. In some embodiments, state machine 440 detects a negative edge of input clock signal 450.

In some embodiments, circuit 220 detects the first edge of input clock signal 450 by detecting two or more consecutive states of the same type (e.g., two or more consecutive low states, two or more consecutive high states), followed by a state of a different type. For example, state machine 440 may detect two consecutive low states followed by a high state, and may determine that input clock signal 450 experienced a transition from a low state to a high state (e.g., on a positive edge). As another example, state machine 440 may detect two consecutive high states followed by a low state, and may determine that input clock signal 450 experienced a transition from a high state to a low state (e.g., on a negative edge). Circuit 220 may use this technique to detect a signal edge when the undersampling clock signal is approximately twice the frequency of input clock signal 450 (e.g., plus or minus an offset amount).

As further shown in FIG. 5, process 500 may include detecting a second edge, of the output clock signal, that corresponds to the first edge (block 550). For example, circuit 220 may detect a second edge of output clock signal 455, using FF B 435 and state machine 440, in a similar manner to detecting the first edge of input clock signal 450, as described above in connection with block 540.

The second edge may correspond to the first edge, such that the first edge and the second edge are a same type of edge (e.g., are both positive edges, are both negative edges, etc.) and/or are related sequentially (e.g., such that no edges of output clock signal 455 are detected in between the first edge and the second edge). For example, state machine 440 may detect a positive edge (e.g., a first edge) of input clock signal 450, and may detect a next-occurring positive edge (e.g., a second edge) of output clock signal 455. As another example, state machine 440 may detect a negative edge (e.g., a first edge) of input clock signal 450, and may detect a next-occurring negative edge (e.g., a second edge) of output clock signal 455.

Circuit 220 is described above as detecting a first edge of input clock signal 450, and then detecting a corresponding second edge of output clock signal 455. However, in some embodiments, circuit 220 detects a first edge of output clock signal 455, and then detects a corresponding second edge of input clock signal 450.

As further shown in FIG. 5, process 500 may include determining a quantity of samples measured between the first edge and the second edge (block 560). For example, circuit 220 may use difference counter 445 to count a quantity of samples measured between the first edge and the second edge. Counting the quantity of samples between the first edge and the second edge may include counting a first sample used to detect the first edge, counting a second sample used to detect the second edge, discounting (e.g., not including in the count) the first sample, discounting the second sample, counting both the first sample and the second sample, or discounting both the first sample and the second sample. In other words, the count may include or exclude either of the first sample or the second sample.

As an example, assume that difference counter 445 receives, from state machine 440, a first indication that state machine 440 detected a positive edge of input clock signal 450. At a later time, assume that difference counter 445 receives, from state machine 440, a second indication that state machine 440 detected a corresponding positive edge of output clock signal 455 (e.g., a next-detected positive edge of output clock signal 455). Difference counter 445 may determine a quantity of samples taken between receiving the first indication and the second indication. In some embodiments, difference counter 445 uses undersampling clock signal 465 to determine the quantity of samples taken (e.g., based on a quantity of positive edges, of undersampling clock signal 465, detected by difference counter 445 after a first sample used to detect the first edge and up to, and including, a second sample used to detect the second edge).

As further shown in FIG. 5, process 500 may include determining a delay between the first edge and the second edge based on the quantity of samples and the offset amount (block 570). For example, circuit 220 may determine delay 460 (e.g., a time difference) between the first edge and the second edge based on the quantity of samples, measured between the first edge and the second edge, and the offset amount. Circuit 220 may multiply the quantity of samples by the offset amount to determine delay 460.

The offset amount may be represented as a time difference between a first amount of time required for one cycle of output clock signal 455 (or input clock signal 450) and a second amount of time required for one cycle of undersampling clock signal 465. As an example, assume that output clock signal 455 operates at a frequency of 400 megahertz (MHz), or 400 million hertz (Hz). Thus, output clock signal 455 requires 2.5 nanoseconds to complete one clock cycle (since 1/400,000,000=0.0000000025 seconds=2.5 nanoseconds). Further, assume that undersampling clock signal 465 operates at a frequency of 410 MHz. Thus, undersampling clock signal 465 requires 2.44 nanoseconds to complete one clock cycle (since 1/410,000,000=0.000000002439 seconds≈2.44 nanoseconds). In this case, the offset amount is equal to 0.06 nanoseconds, or 60 picoseconds (e.g., 2.5 nanoseconds−2.44 nanoseconds=0.06 nanoseconds=60 picoseconds).

Continuing with the above example, assume that circuit 220 detected the second edge on the tenth sample following detection of the first edge. In this case, undersampling clock signal 465 sampled nine different time steps of input clock signal 450 (and output clock signal 455) before sampling a positive edge of output clock signal 455 on the tenth sample. Each sampled time step of is 60 picoseconds apart. Thus, the total sampled length is equal to 600 picoseconds (10 samples×60 picoseconds per sample). This indicates that the delay between the first positive edge, of input clock signal 450, and the second positive edge, of output clock signal 455, is 600 picoseconds.

As further shown in FIG. 5, process 500 may include providing information that identifies the delay (block 580). For example, circuit 220 may provide information that identifies the delay to a particular component of circuit 220 (e.g., shown in FIG. 2 or not shown in FIG. 2). Additionally, or alternatively, circuit 220 may provide information that identifies the delay to another device, such as testing device 210. As an example, testing device 210 may receive information that identifies the delay, and may use the information to test circuit 220, to calibrate circuit 220, etc. In this way, circuit 220 may quickly and accurately determine a delay between a first clock signal (e.g., an edge of input clock signal 450) and a second clock signal (e.g., a corresponding edge of output clock signal 455), and may use this information for various purposes.

Although FIG. 5 shows example blocks of process 500, in some embodiments, process 500 includes additional blocks, fewer blocks, different blocks, or differently arranged blocks than those depicted in FIG. 5. Additionally, or alternatively, two or more of the blocks of process 500 may be performed in parallel.

FIGS. 6A-6D are diagrams of an example embodiment 600 relating to example process 500 shown in FIG. 5. FIGS. 6A-6D show an example of measuring a delay between two signal edges using an undersampling clock.

Figure 6A:
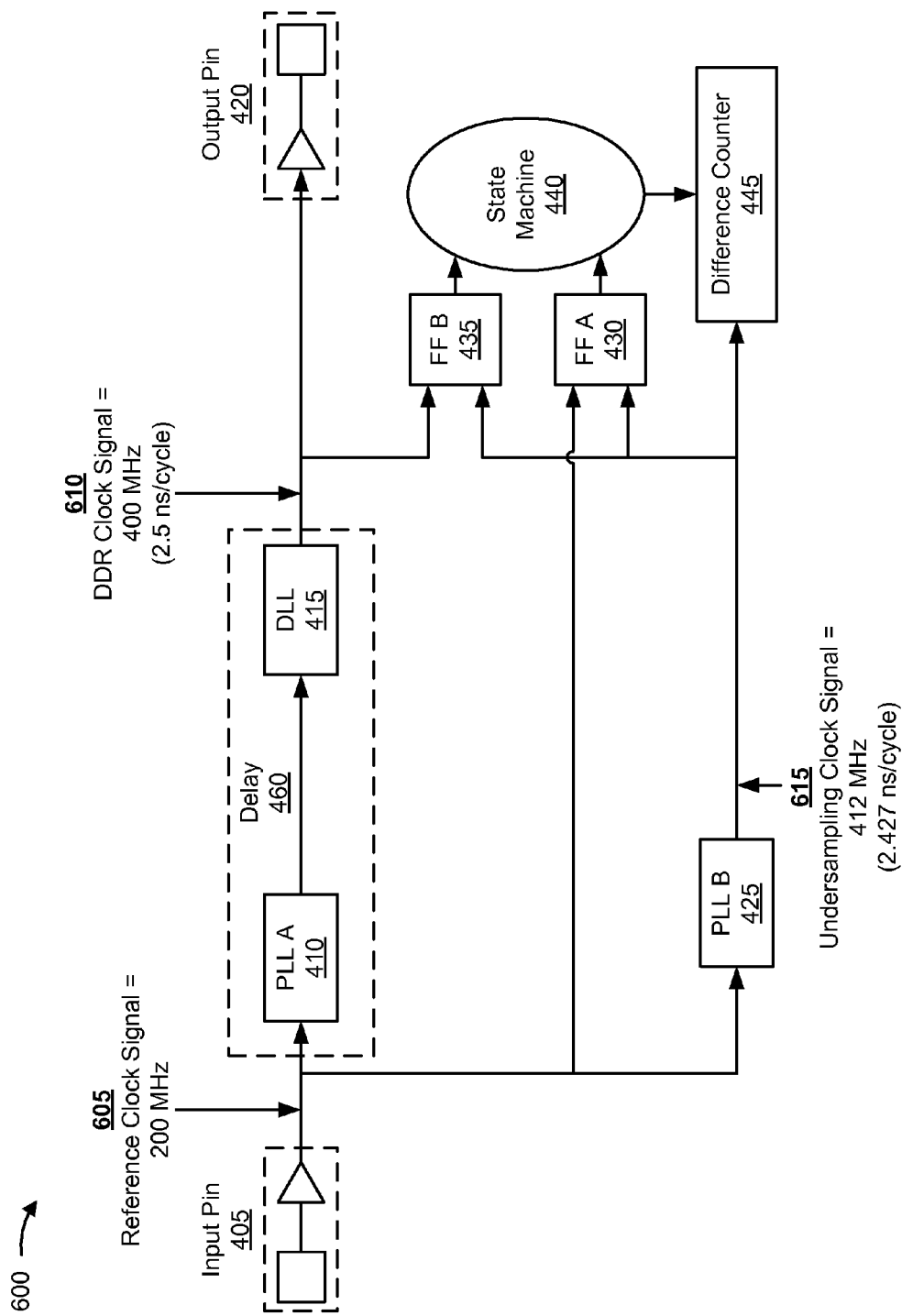
FIGS. 6A-6D are diagrams of an example embodiment relating to the example process shown in FIG. 5.

As shown in FIG. 6A, and by reference number 605, assume that circuit 220 receives, via input pin 405, a reference clock signal. The reference clock signal may correspond to input clock signal 450. Further, assume that the reference clock signal has a frequency of 200 MHz. As shown by reference number 610, assume that circuit 220 uses the reference clock signal to generate a double data rate (DDR) clock signal with a frequency of 400 MHz. The DDR clock signal may correspond to output clock signal 455. As shown by reference number 615, assume that circuit 220 uses the reference clock signal to generate an undersampling clock signal with a frequency of 412 MHz. The undersampling clock signal may correspond to undersampling clock signal 465. As further shown, the 400 MHz DDR clock signal completes one clock cycle in 2.5 nanoseconds (ns), and the 412 MHz undersampling clock signal completes one clock cycle in 2.427 nanoseconds. Thus, the undersampling clock signal is offset from the DDR clock signal by 73 picoseconds (2.5 nanoseconds−2.427 nanoseconds=0.073 nanoseconds=73 picoseconds).

Figure 6B:
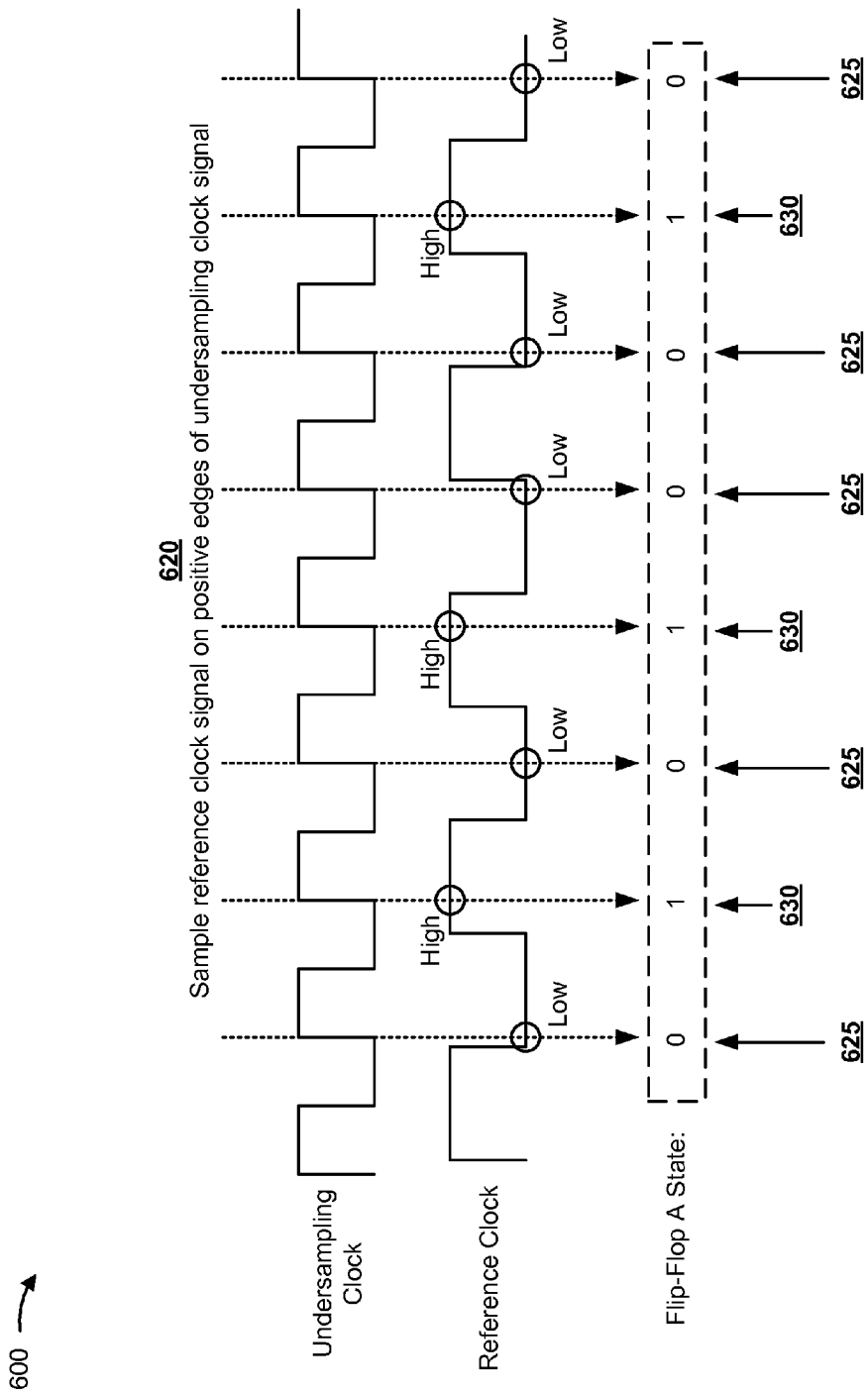

As shown in FIG. 6B, and by reference number 620, circuit 220 uses the undersampling clock signal to sample the reference clock signal. For example, assume that FF A 430 samples the reference clock signal when FF A 430 detects a positive edge of the undersampling clock signal. As shown by reference number 625, assume that FF A 430 determines that the reference clock signal is in the low state (e.g., represented by a zero) when samples one, three, five, six, and eight are taken. As shown by reference number 630, assume that FF A 430 determines that the reference clock signal is in the high state (e.g., represented by a one) when samples two, four, and seven are taken.

Figure 6C:
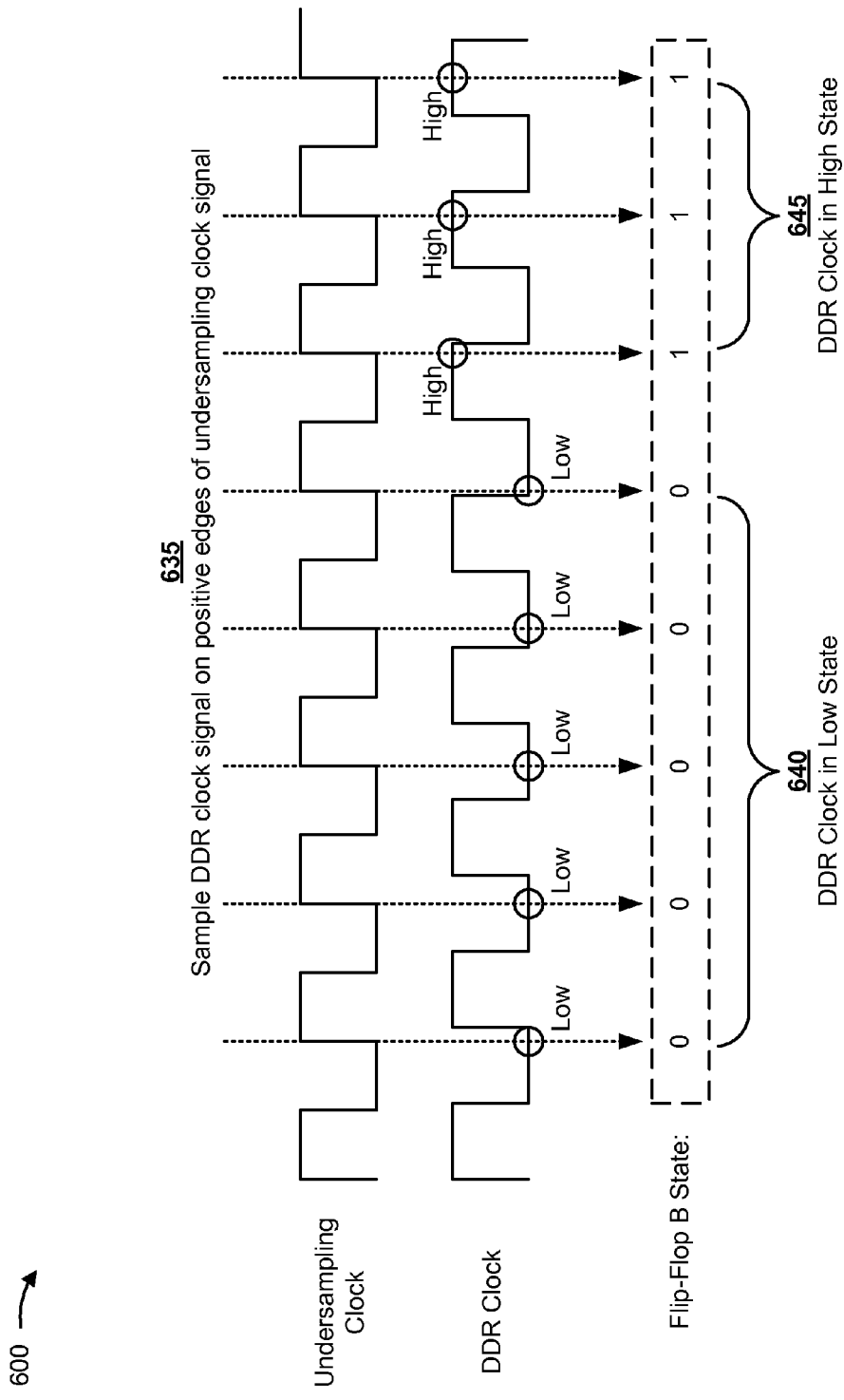

As shown in FIG. 6C, and by reference number 635, circuit 220 also uses the undersampling clock signal to sample the DDR clock signal. For example, assume that FF B 435 samples the DDR clock signal when FF B 435 detects a positive edge of the undersampling clock signal. As shown by reference number 640, assume that FF B 435 determines that the DDR clock signal is in the low state (e.g., represented by a zero) for the first five samples. As shown by reference number 645, assume that FF B 435 determines that the DDR clock signal is in the high state (e.g., represented by a one) for the next three samples.

Figure 6D:
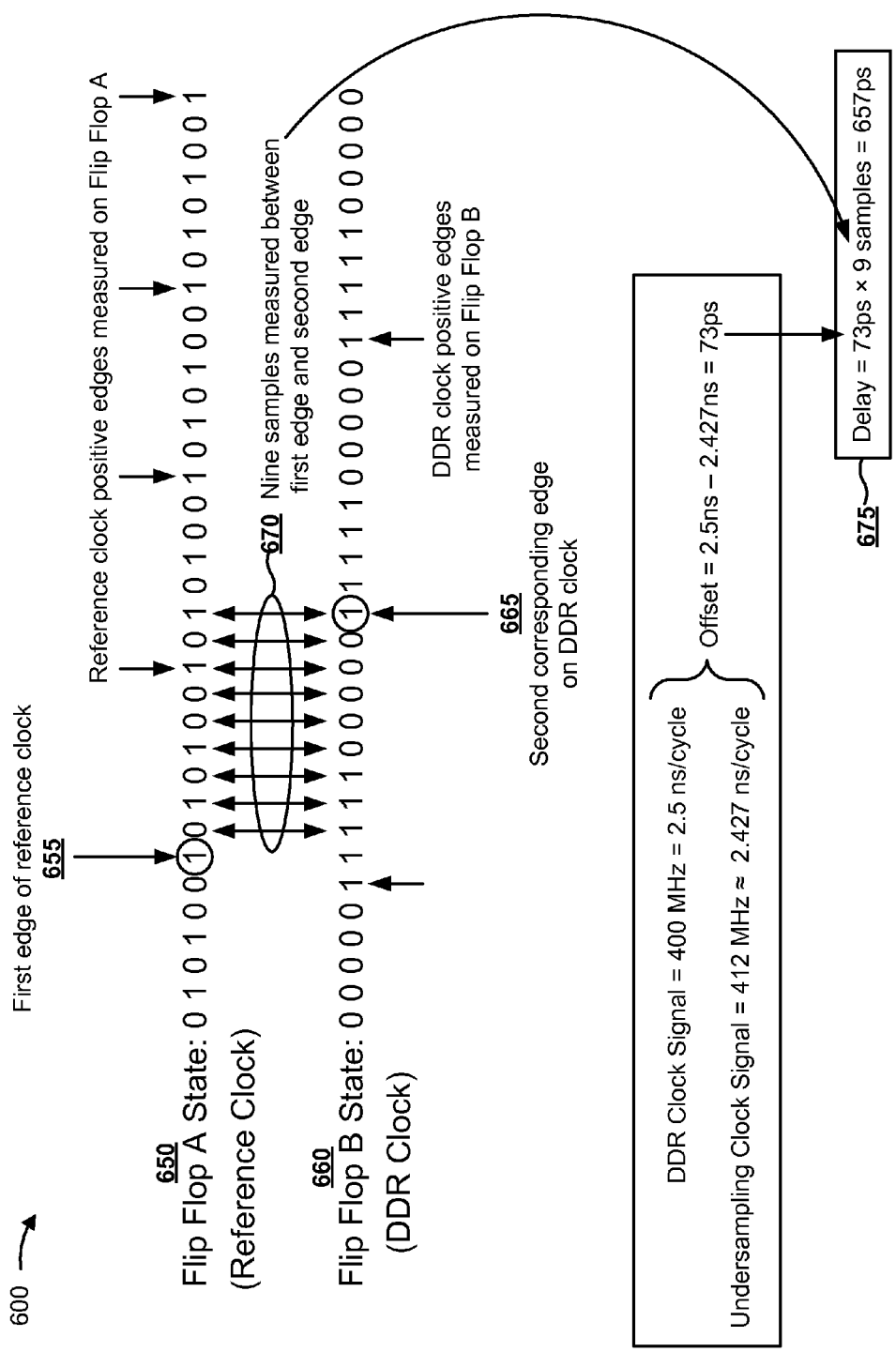

As shown in FIG. 6D, and by reference number 650, assume that FF A 430 takes many samples of the reference clock signal. In FIG. 6D, a positive edge of a clock signal (e.g., a transition from a low state to a high state) is represented by a transition from a zero to a one after two or more consecutive zeroes. As shown by reference number 655, assume that FF A 430 detects a first positive edge of the reference clock signal.

As shown by reference number 660, assume that FF B 435 takes many samples of the DDR clock signal. As shown by reference number 665, assume that FF B 435 detects a second positive edge, of the DDR clock signal, that corresponds to the first positive edge of the reference clock signal. For example, FF B 435 detects a positive edge, of the DDR clock signal, that occurs directly after detecting the first positive edge of the reference clock signal, with no intervening positive edges being detected on the DDR clock signal.

As shown by reference number 670, assume that circuit 220 (e.g., using difference counter 445) determines that nine samples were measured between the first positive edge of the reference clock signal and the second positive edge of the DDR clock signal. As shown by reference number 675, circuit 220 may multiply this quantity of samples (e.g., nine) by the offset between the DDR clock signal and the undersampling clock signal (e.g., 73 picoseconds, determined as described herein in connection with FIG. 6A), to calculate a delay of 657 picoseconds between a reference clock signal edge and a corresponding DDR clock signal edge. Circuit 220 may provide information that identifies this delay of 657 picoseconds to another component and/or device (e.g., testing device 210) to analyze and/or improve operation of circuit 220.

As indicated above, FIGS. 6A-6D are provided merely as an example. Other examples are possible and may differ from what was described with regard to FIGS. 6A-6D.

Figure 7:
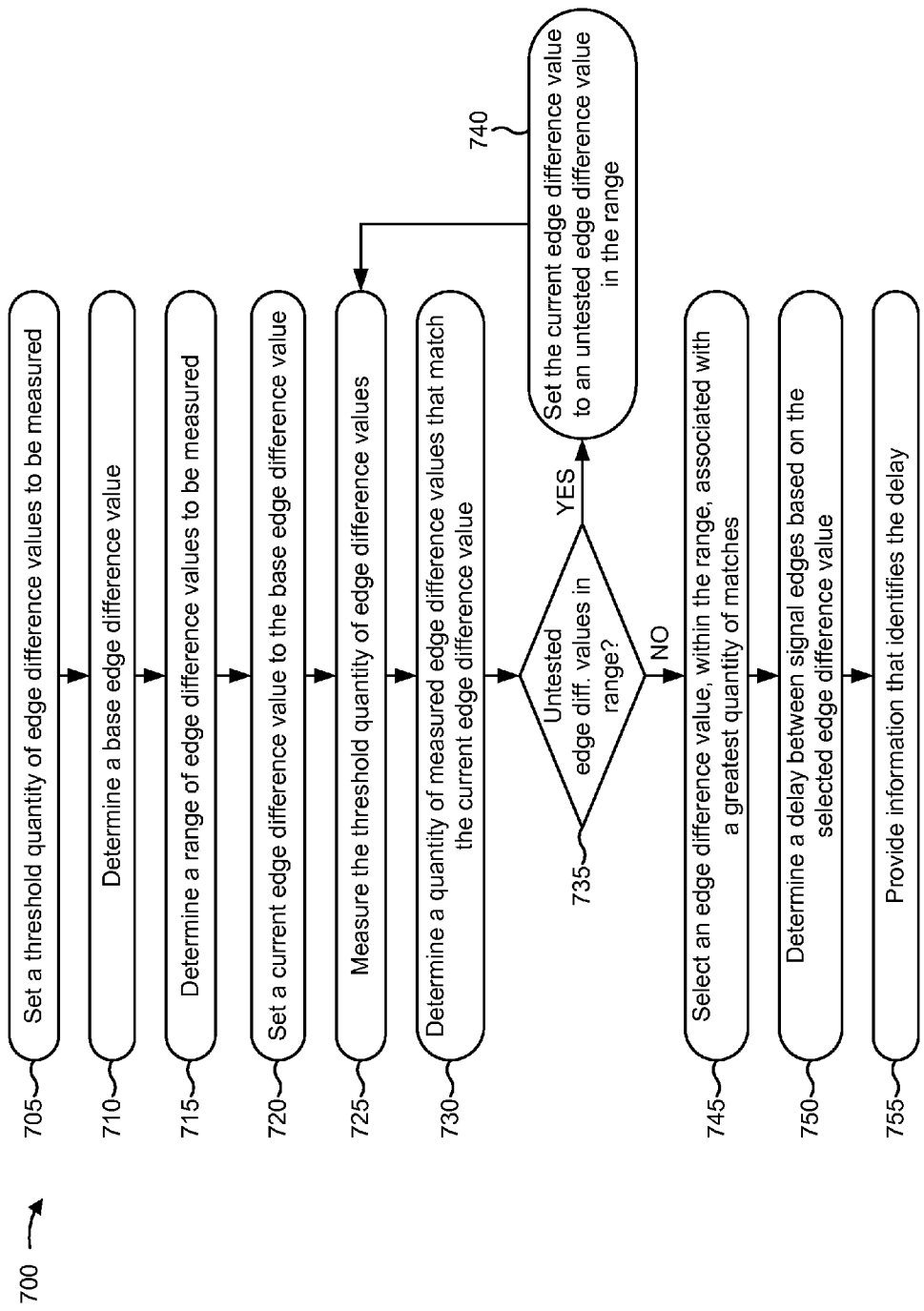
FIG. 7 is a flow chart of an example process for reducing the impact of jitter when measuring differences in delay between two signal edges using an undersampling clock.

FIG. 7 is a flow chart of an example process 700 for reducing the impact of jitter when measuring differences in delay between two signal edges using an undersampling clock. In some embodiments, one or more process blocks of FIG. 7 are performed by circuit 220. In some embodiments, one or more process blocks of FIG. 7 are performed by another device or a group of devices separate from or including circuit 220, such as testing device 210. In some embodiments, one or more process blocks of FIG. 7 are performed by state machine 440, which may receive information (e.g., via a testing interface) to control one or more parameters associated with process 700, and may store information associated with process 700 in one or more registers.

As shown in FIG. 7, process 700 may include setting a threshold quantity of edge difference values to be measured (block 705). For example, circuit 220 may set a threshold quantity of edge difference values to be measured (e.g., based on input received from a tester and/or testing device 210). An edge difference value may refer to a quantity of samples measured between an edge of a first clock signal (e.g., input clock signal 450) and a corresponding edge of a second clock signal (e.g., output clock signal 455). Circuit 220 may set the threshold quantity to ensure that a threshold sample size (e.g., a window size) of edge difference values are measured. Additionally, or alternatively, circuit 220 may set a threshold time period during which edge difference values are to be measured.

Due to the effects of PLL clock jitter, a measured edge difference value may vary from one measurement to another measurement. Because of this, one particular edge difference value may not be an accurate representation of an actual time difference (e.g., delay) between two signal edges. By setting a threshold window size that controls a quantity of edge difference values measured by circuit 220, statistical techniques may be used to increase the accuracy of a selected edge difference value.

As further shown in FIG. 7, process 700 may include determining a base edge difference value (block 710). For example, circuit 220 may determine a base edge difference value by determining a quantity of samples measured between an edge of a first clock signal and a corresponding edge of a second clock signal, as described herein in connection with FIG. 5 (e.g., blocks 510-560).

As further shown in FIG. 7, process 700 may include determining a range of edge difference values to be measured (block 715). For example, circuit 220 may determine a range of edge difference values to be measured (e.g., based on input received from a tester and/or testing device 210). Circuit 220 may test each edge difference value in the range to determine a quantity of occurrences of each edge difference value across multiple sampling runs that measure the threshold quantity of edge difference values. As an example, assume that circuit 220 sets a threshold quantity of 10,000 edge difference measurements. Circuit 220 may determine a base edge difference value of 10 samples, and may determine a range of 5, with 2 values greater than 10, and 2 values less than 10. Thus, the entire range to be tested by circuit 220 includes edge difference values of 8 samples, 9 samples, 10 samples, 11 samples, and 12 samples.

In some embodiments, circuit 220 determines the range of edge difference values based on the base difference value. For example, circuit 220 may identify a base edge difference value of 15 samples, may receive information that identifies a range of +/−3 samples, and may determine the following range based on the base edge difference value and the range: 12 samples, 13 samples, 14 samples, 15 samples, 16 samples, 17 samples, and 18 samples (e.g., 7 total edge difference values).

Circuit 220 determines the range based on an amount of jitter associated with circuit 220 (e.g., an amount of jitter associated with PLL A 410 and/or PLL B 425), in some embodiments. For example, circuit 220 may set the range to a value that accounts for a span of total jitter delay of PLL A 410 and/or PLL B 425, and which may also account for some additional margin. For example, if a total jitter delay is 150 picoseconds and an offset value is equal to 40 picoseconds, circuit 220 may set a range of 5 to account for the 150 picoseconds of jitter and an additional margin of 50 picoseconds (e.g., 40 picoseconds×5=200 picoseconds, and 200 picoseconds−150 picoseconds=50 picoseconds).

As further shown in FIG. 7, process 700 may include setting a current edge difference value to the base edge difference value (block 720). For example, circuit 220 may set a current edge difference value to the base edge difference value determined as described in connection with block 710. A current edge difference value may refer to an edge difference value to be tested by circuit 220 on a particular sampling run (e.g., a sampling run that measures a threshold quantity of edge difference values). Circuit 220 may test different edge difference values in the range during different sampling runs (e.g., may test a single edge difference value during a single sampling run). Additionally, or alternatively, circuit 220 may test all of the edge difference values in the range during a single sampling run.

As further shown in FIG. 7, process 700 may include measuring the threshold quantity of edge difference values (block 725), and determining a quantity of measured edge difference values that match the current edge difference value (block 730). For example, circuit 220 may measure edge difference values until a threshold quantity of edge difference values have been measured. For each measured edge difference value, circuit 220 may determine whether the measured edge difference value matches the current edge difference value. If so, circuit 220 may increment a counter that tracks a quantity of matches for the current edge difference value. If not, circuit 220 may not increment the counter.

As further shown in FIG. 7, process 700 may include determining whether there are any untested edge difference values in the range (block 735). For example, circuit 220 may determine whether all of the edge difference values in the range have been set to a current edge difference value that is compared to edge difference values measured during a sampling run. In other words, circuit 220 may determine whether all of the edge difference values have been tested in different sampling runs.

If there are untested edge difference values in the range (block 735—YES), then process 700 may include setting the current edge difference value to an untested edge difference value in the range (block 740), and returning to block 725 to test the new current edge difference value. For example, if circuit 220 determines that there is at least one untested value in the range, then circuit 220 may set the current edge difference value to an untested edge difference value to generate a new current edge difference value. Circuit 220 may then measure the threshold quantity of edge difference values (e.g., as described herein in connection with block 725), and may determine a quantity of measured edge difference values that match the new current edge difference value (e.g., as described herein in connection with block 730).

If there are no untested edge difference values in the range (block 735—NO), then process 700 may include selecting an edge difference value, within the range, associated with a greatest quantity of matches (block 745). For example, if circuit 220 determines that all edge difference values in the range have been tested, then circuit 220 may select an edge difference value, within the range, associated with a greatest quantity of matches. Each edge difference value may be associated with a different quantity of matches (e.g., may have matched a different quantity of measured edge difference values during a sampling run). In some embodiments, circuit 220 selects the edge difference value with a greatest quantity of matches as an edge difference value to be used to determine the delay associated with circuit 220.

In some embodiments, circuit 220 selects an edge difference value based on a weighted average of each edge difference value in the range. For example, circuit 220 may assign a weight to each edge difference value based on a quantity of times that a respective edge difference value matched a measured edge difference value during a sampling run.

In some embodiments, circuit 220 performs an error check prior to selecting an edge difference value. For example, circuit 220 may add the quantity of matches for each respective edge difference value within the range. The sum of these matches should be close to the threshold quantity of measured edge difference values on a single sampling run. Circuit 220 may determine whether the sum is within a threshold tolerance range of the threshold quantity. If the sum is within the threshold tolerance range, circuit 220 may select the edge difference value with the greatest quantity of matches. If the sum is not within the threshold tolerance range, circuit 220 may perform one or more sampling runs again (e.g., may return to block 720).

As further shown in FIG. 7, process 700 may include determining a delay between signal edges based on the selected edge difference value (block 750), and providing information that identifies the delay (block 755). For example, circuit 220 may determine a delay based on the selected edge difference value and an offset value, as described herein in connection with FIG. 5. As an example, circuit 220 may multiply the selected edge difference value and the offset value to determine the delay. Circuit 220 may provide information that identifies the delay to a component of circuit 220, another component, and/or another device (e.g., testing device 210) to analyze and/or improve operation of circuit 220. By testing a range of different edge difference values, circuit 220 may account for random jitter, which may affect a particular edge difference value. In this way, circuit 220 may determine a more accurate value for the delay by testing a variety of edge difference values.

Although FIG. 7 shows example blocks of process 700, in some embodiments, process 700 includes additional blocks, fewer blocks, different blocks, or differently arranged blocks than those depicted in FIG. 7. Additionally, or alternatively, two or more of the blocks of process 700 may be performed in parallel.

FIGS. 8A-8D are diagrams of an example embodiment 800 relating to example process 700 shown in FIG. 7. FIGS. 8A-8D show an example of reducing the impact of jitter when measuring differences in delay between two signal edges using an undersampling clock.

Figure 8A:
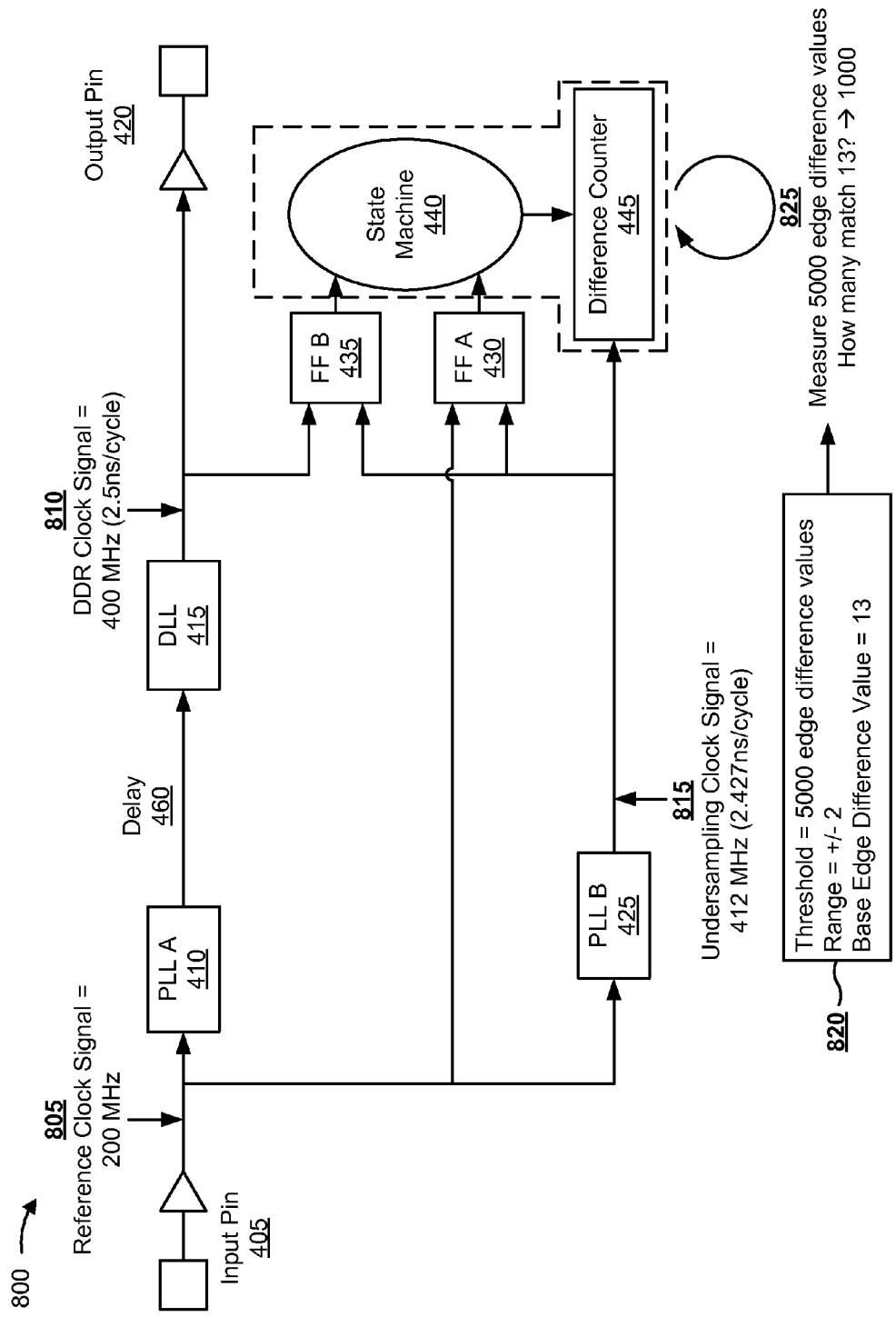
FIGS. 8A-8D are diagrams of an example embodiment relating to the example process shown in FIG. 7.

As shown in FIG. 8A, and by reference number 805, assume that circuit 220 receives a reference clock signal with a frequency of 200 MHz. As shown by reference number 810, assume that circuit 220 uses the reference clock signal to generate a DDR clock signal with a frequency of 400 MHz. As shown by reference number 615, assume that circuit 220 uses the reference clock signal to generate an undersampling clock signal with a frequency of 412 MHz. As further shown, the 400 MHz DDR clock signal completes one clock cycle in 2.5 nanoseconds, and the 412 MHz undersampling clock signal completes one clock cycle in 2.427 nanoseconds. Thus, the undersampling clock signal is offset from the DDR clock signal by 73 picoseconds (2.5 nanoseconds−2.427 nanoseconds=0.073 nanoseconds=73 picoseconds).

As shown by reference number 820, assume that circuit 220 receives information that identifies a threshold quantity of 5000 edge difference value measurements per sampling run, and a range of +/−2 from a determined base edge difference value. As further shown, assume that circuit 220 determines a base edge difference value of 13 (e.g., by carrying out process 500, described herein in connection with FIG. 5). As shown by reference number 825, assume that circuit 220 performs a sampling run, and measures 5000 edge difference values in the sampling run. As further shown, assume that circuit 220 determines that 1000 of the measured edge difference values match the base edge difference value of 13.

Figure 8B:
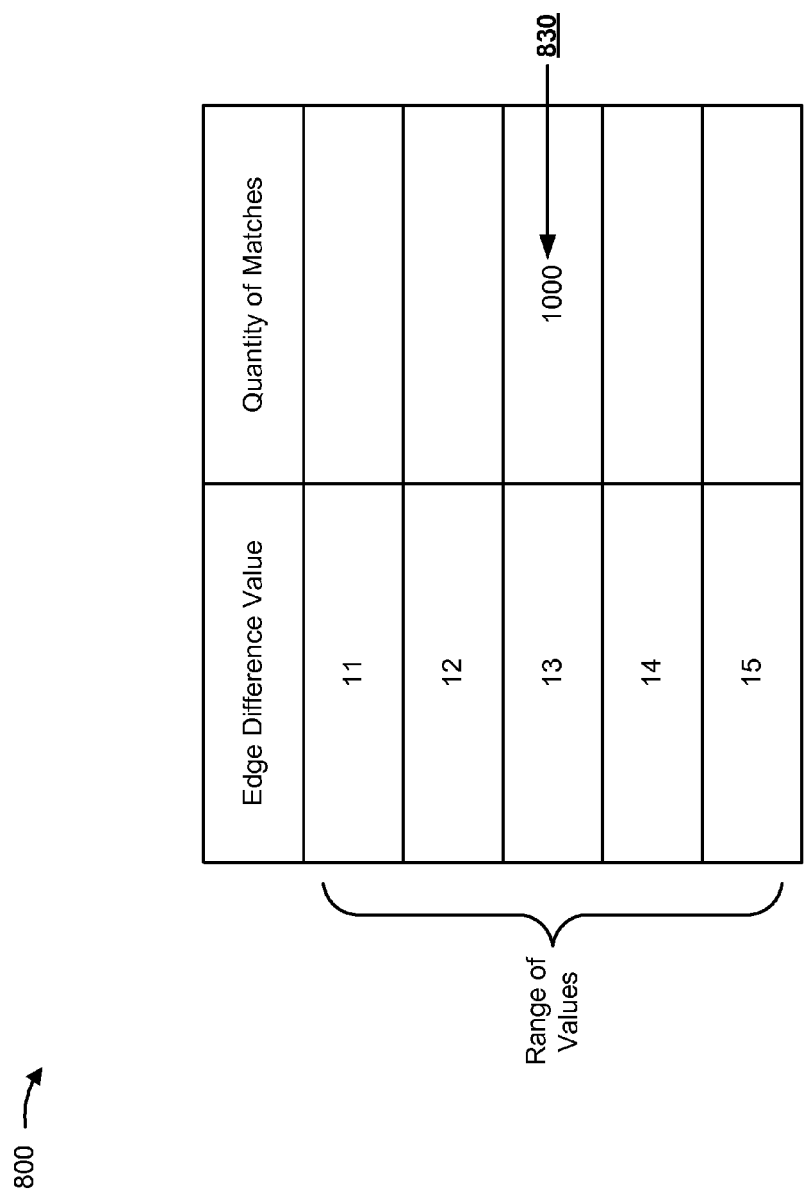

As shown in FIG. 8B, and by reference number 830, circuit 220 may store an indication of a quantity of matches between the base edge difference value of 13 and an edge difference value measured during the sampling run described in connection with FIG. 8A. In other words, circuit 220 may store an indication that 1000 edge difference values, measured during the sampling run, had a value of 13.

Figure 8C:
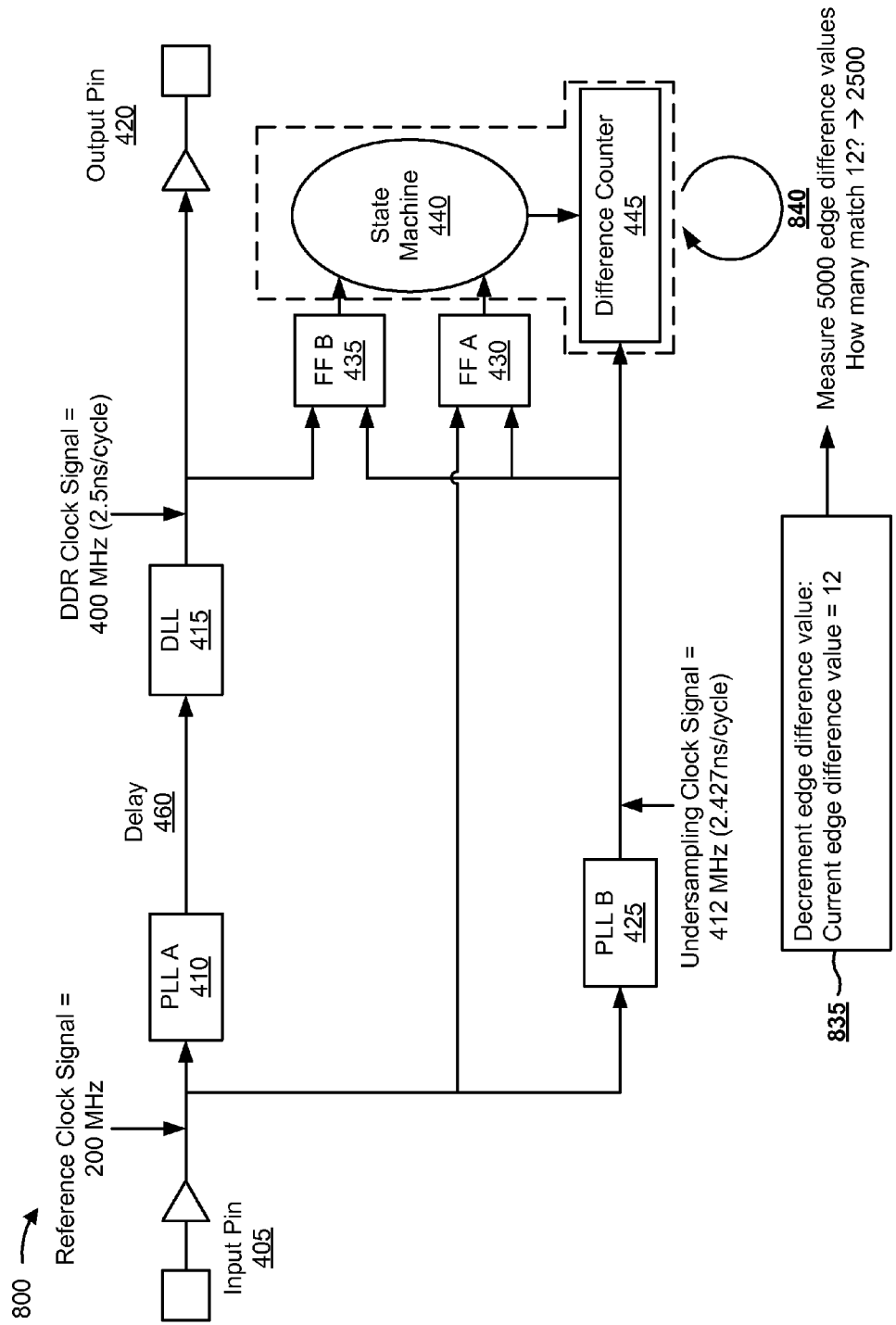

As shown in FIG. 8C, and by reference number 835, assume that circuit 220 decrements the edge difference value to a current edge difference value of 12. As shown by reference number 840, assume that circuit 220 performs another sampling run, and measures 5000 edge difference values in the sampling run. As further shown, assume that circuit 220 determines that 2500 of the measured edge difference values match the current edge difference value of 12.

Figure 8D:
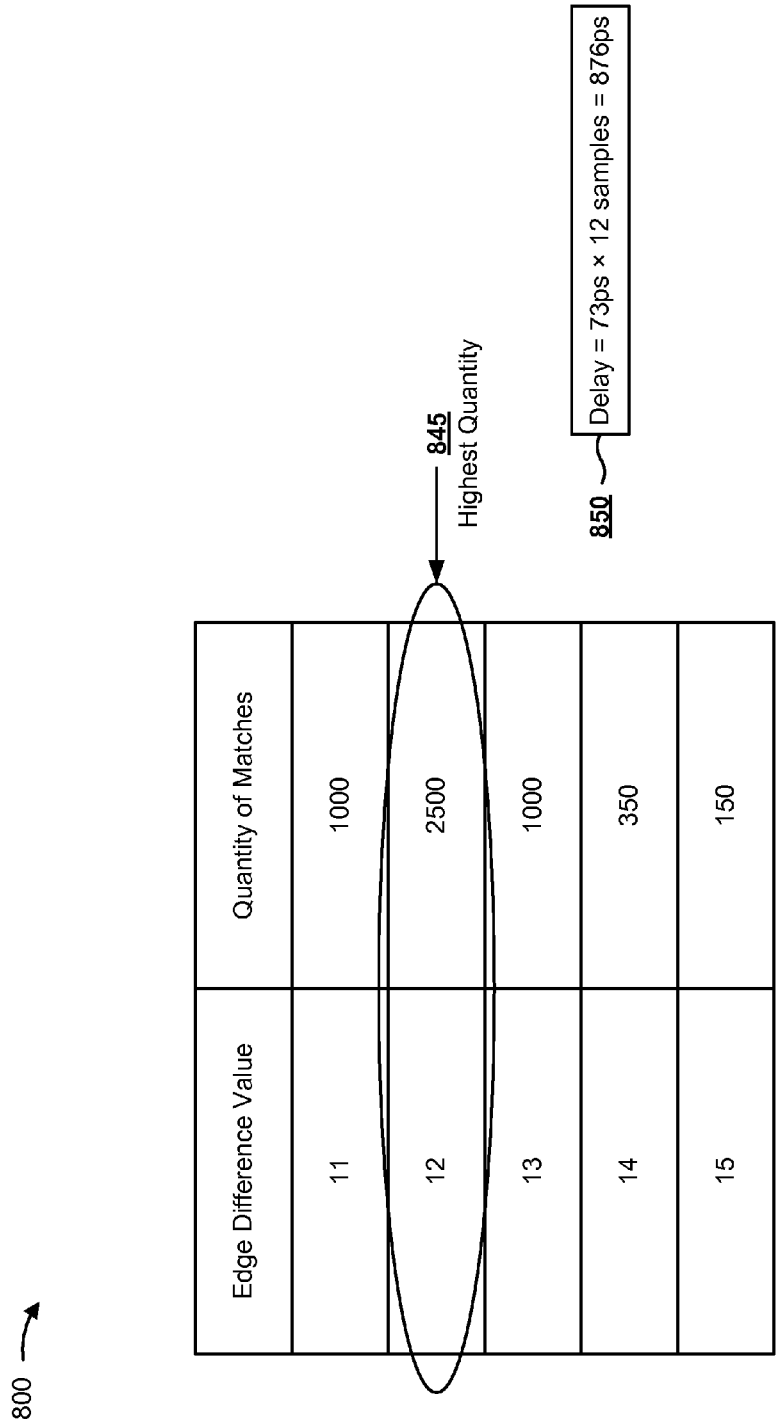

As shown in FIG. 8D, assume that circuit 220 continues to modify the current edge difference value to perform separate sampling runs and measure a quantity of matches for the other edge difference values in the range (e.g., 11, 14, and 15). For example, assume that circuit 220 identified 1000 matches for the edge difference value of 11, identified 2500 matches for the edge difference value of 12, identified 1000 matches for the edge difference value of 13, identified 350 matches for the edge difference value of 14, and identified 150 matches for the edge difference value of 15. As shown by reference number 845, assume that circuit 220 determines that the edge difference value of 12 had the greatest quantity of matches, and selects this edge difference value (e.g., 12) to determine the delay.

As shown by reference number 850, circuit 220 and/or testing device 210 may multiply the selected edge difference value (e.g., 12) by the offset between the DDR clock signal and the undersampling clock signal (e.g., 73 picoseconds, determined as described herein in connection with FIG. 8A), to calculate a delay of 876 picoseconds between a DDR clock signal edge and a corresponding reference clock signal edge.

Additionally, or alternatively, circuit 220 and/or testing device 210 may calculate an edge difference value based on a weighted average of edge difference values and a respective quantity of matches of each edge difference value, where each edge difference value is weighed based on the quantity of matches. For example, circuit 220 may calculate the edge difference value as follows:

$$[(11 \times 1000)+(12 \times 2500)+(13 \times 1000)+(14 \times 350)+(15 \times 150)]/5000=12.23.$$

Circuit 220 and/or testing device 210 may use the calculated edge difference value of 12.23 to determine the delay. For example, circuit 220 and/or testing device 210 may multiply the calculated edge difference value (e.g., 12.23) by the offset between the DDR clock signal and the undersampling clock signal (e.g., 73 picoseconds), to calculate a delay of 892.79 picoseconds (e.g., which may be rounded up to 893 picoseconds) between a reference clock signal edge and a corresponding DDR clock signal edge. Circuit 220 may provide information that identifies the delay of 892.79 ps to a component of circuit 220, to another component, and/or to another device (e.g., testing device 210) to analyze and/or improve operation of circuit 220.

As indicated above, FIGS. 8A-8D are provided merely as an example. Other examples are possible and may differ from what was described with regard to FIGS. 8A-8D.

The foregoing disclosure provides illustration and description, but is not intended to be exhaustive or to limit the embodiments to the precise form disclosed. Modifications and variations are possible in light of the above disclosure or may be acquired from practice of the embodiments.

As used herein, a component is intended to be broadly construed as hardware, firmware, or a combination of hardware and software.

It will be apparent that systems and/or methods, as described herein, may be implemented in many different forms of software, firmware, and hardware in the embodiments illustrated in the figures. The actual software code or specialized control hardware used to implement these systems and/or methods is not limiting of the embodiments. Thus, the operation and behavior of the systems and/or methods were described without reference to the specific software code—it being understood that software and hardware can be designed to implement the systems and/or methods based on the description herein.

Even though particular combinations of features are recited in the claims and/or disclosed in the specification, these combinations are not intended to limit the disclosure of possible embodiments. In fact, many of these features may be combined in ways not specifically recited in the claims and/or disclosed in the specification. Although each dependent claim listed below may directly depend on only one claim, the disclosure of possible embodiments includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Where only one item is intended, the term "one" or similar language is used. Further, the phrase "based on" is intended to mean "based, at least in part, on" unless explicitly stated otherwise.

What is claimed is:

1. A method, comprising:
    sampling, by a circuit, a first clock signal using an undersampling clock signal;
    sampling, by the circuit, a second clock signal using the undersampling clock signal,
        the undersampling clock signal having a frequency that is different from a frequency of the first clock signal or a frequency of the second clock signal by an offset amount, and
        the frequency of the second clock signal being different from the frequency of the first clock signal;
    detecting, by the circuit and based on sampling the first clock signal, a first edge of the first clock signal;
    detecting, by the circuit and based on sampling the second clock signal, a second edge of the second clock signal;
    determining, by the circuit, a quantity of samples measured between a first sample, used to detect the first edge, and a second sample used to detect the second edge; and
    determining, by the circuit and based on the quantity of samples and the offset amount, a delay associated with the first clock signal and the second clock signal.

2. The method of claim 1, where the first edge is a type of edge that includes:
    a positive edge, or
    a negative edge; and
    where the second edge is a same type of edge as the first edge.

3. The method of claim 1, where the frequency of the second clock signal is an integer multiple of the frequency of the first clock signal.

4. The method of claim 1, further comprising:
    determining a first cycle time of the undersampling clock signal;
    determining a second cycle time of the first clock signal or the second clock signal;
    determining the offset amount as a difference between the first cycle time and the second cycle time; and
    where determining the delay further comprises:
        determining the delay based on multiplying the offset amount and the quantity of samples.

5. The method of claim 1, further comprising:
    outputting information identifying the delay to a testing device, electronically coupled to the circuit, to permit the testing device to test or calibrate the circuit based on the delay.

6. The method of claim 1, where determining the quantity of samples comprises at least one of:
    counting the first sample in the quantity of samples;
    counting the second sample in the quantity of samples;
    counting the first sample and the second sample in the quantity of samples; or
    preventing the first sample and the second sample from being counted in the quantity of samples.

7. A device, comprising:
    one or more components of a circuit to:
        measure a first sample, of a first clock signal, using a sampling signal;
        measure a second sample, of a second clock signal, using the sampling signal,
            the sampling signal having a frequency that is based on a frequency of the first clock signal or a frequency of the second clock signal, and
            the frequency of the first clock signal being different from the frequency of the second clock signal;
        detect, based on measuring the first sample, a first state transition of the first clock signal;
        detect, based on measuring the second sample, a second state transition of the second clock signal,
            the second state transition being a same type of transition as the first state transition; and
        determine a delay between the first state transition and the second state transition based on detecting the first state transition, detecting the second state transition, and a cycle time of the sampling signal.

8. The device of claim 7, where the one or more components, when determining the delay, are to:
    determine a time difference between the cycle time of the sampling signal and a cycle time of the first clock signal or the second clock signal; and
    determine the delay based on the time difference.

9. The device of claim 8, where the one or more components are further to:
    increment a counter value for each sample measured, using the sampling signal, after measuring the first sample and before measuring the second sample;
    increment the counter value based on measuring the second sample; and
    where the one or more components, when determining the delay, are to:
        determine the delay based on multiplying the counter value and the time difference.

10. The device of claim 7, where the one or more components are further to:

determine a cycle time of the first clock signal or a cycle time of the second clock signal;
set the cycle time of the sampling signal based on the cycle time of the first clock signal or the cycle time of the second clock signal;
determine a time difference between the cycle time of the sampling signal and the cycle time of the first clock signal or the cycle time of the second clock signal; and
where the one or more components, when determining the delay, are to:
determine the delay based on the time difference.

11. The device of claim 7, where the second state transition is a next-occurring state transition, of the second clock signal, that is a same type of state transition as the first state transition.

12. The device of claim 7, where the one or more components are further to:
measure a base edge difference value that represents a quantity of cycles traversed by the sampling signal after measuring the first sample and up to, and including, measuring the second sample;
determine a plurality of edge difference values to be measured,
the plurality of edge difference values including the base edge difference value;
measure edge difference values during a sampling run;
determine a quantity of measured edge difference values, measured during the sampling run, that match an edge difference value of the plurality of edge difference values; and
where the one or more components, when determining the delay, are to:
determine the delay based on the edge difference value.

13. The device of claim 12, where the one or more components are further to:
receive information that identifies a range of edge difference values to be measured; and
where the one or more components, when determining the plurality of edge difference values to be measured, are to:
determine the plurality of edge difference values to be measured based on the range and further based on the base edge difference value.

14. The device of claim 7, where the one or more components are further to:
output information that identifies the delay.

15. A system, comprising:
one or more circuits to:
measure a first sample, of a first clock signal, using an undersampling signal;
measure a second sample, of a second clock signal, using the undersampling signal,
the undersampling signal having a frequency that is based on a frequency of the first clock signal or a frequency of the second clock signal, and
the frequency of the first clock signal being different from the frequency of the second clock signal;
detect, based on measuring the first sample, a first edge of the first clock signal;
detect, based on measuring the second sample, a second edge of the second clock signal; and
determine a delay, associated with the first clock signal and the second clock signal, based on detecting the first edge, based on detecting the second edge, based on a first cycle time of the undersampling signal, and based on a second cycle time of the first clock signal or the second clock signal.

16. The system of claim 15, where the one or more circuits are further to:
determine a time difference between the first cycle time and the second cycle time;
determine an edge difference value that represents a quantity of cycles, of the undersampling signal, measured after measuring the first sample and up to measuring the second sample; and
where the one or more circuits, when determining the delay, are to:
determine the delay based on the time difference and the edge difference value.

17. The system of claim 15, where the first edge is a positive edge; and
where the second edge is a positive edge measured after detecting the first edge, without detecting any intervening positive edges of the second clock signal.

18. The system of claim 15, where the one or more circuits are further to:
determine a plurality of edge difference values to be measured;
measure edge difference values during a sampling run;
determine a first quantity of the measured edge difference values that match a first edge difference value of the plurality of edge difference values;
determine a second quantity of the measured edge difference values that match a second edge difference value of the plurality of edge difference values;
compare the first quantity and the second quantity;
select the first edge difference value or the second edge difference value, as a selected edge difference value, based on comparing the first quantity and the second quantity; and
where the one or more circuits, when determining the delay, are to:
determine the delay based on the selected edge difference value.

19. The system of claim 15, where the one or more circuits are further to:
provide information that identifies the delay to a component for analysis or modification of the one or more circuits.

20. The method of claim 1, where determining the delay comprises:
determining a cycle time of the first clock signal or the second clock signal;
setting a cycle time of the undersampling clock signal based on the cycle time of the first clock signal or the second clock signal;
determining a time difference between the cycle time of the undersampling clock signal and the cycle time of the first clock signal or the second clock signal; and
determining the delay based on the time difference.

* * * * *